(12) United States Patent
Choi et al.

(10) Patent No.: US 7,935,578 B2
(45) Date of Patent: May 3, 2011

(54) THIN FILM TRANSISTOR, THIN FILM TRANSISTOR PANEL, AND METHOD OF MANUFACTURING THE SAME

(75) Inventors: Joon-Hoo Choi, Seoul (KR); Joon-Chul Goh, Seoul (KR); Beohm-Rock Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 692 days.

(21) Appl. No.: 11/375,714

(22) Filed: Mar. 13, 2006

(65) Prior Publication Data

US 2006/0202204 A1 Sep. 14, 2006

(30) Foreign Application Priority Data

Mar. 14, 2005 (KR) .................... 10-2005-0021014

(51) Int. Cl.
*H01L 21/00* (2006.01)
*H01L 21/84* (2006.01)

(52) U.S. Cl. . 438/149; 438/150; 438/680; 257/E51.005; 257/E29.151

(58) Field of Classification Search .............. 438/149, 438/150, FOR. 184, FOR. 201, 680; 257/E51.005, 257/E29.151
See application file for complete search history.

(56) References Cited

U.S. PATENT DOCUMENTS

| | | | | |
|---|---|---|---|---|
| 5,289,300 A | * | 2/1994 | Yamazaki et al. | 349/42 |
| 5,688,382 A | * | 11/1997 | Besen et al. | 204/192.12 |
| 6,346,718 B1 | | 2/2002 | Yamanaka et al. | |
| 6,455,400 B1 | * | 9/2002 | Smith et al. | 438/482 |
| 6,906,346 B2 | * | 6/2005 | Nishitani et al. | 257/70 |
| 2001/0009447 A1 | * | 7/2001 | Ohta et al. | 349/43 |
| 2002/0006689 A1 | * | 1/2002 | Miyasaka | 438/149 |
| 2002/0030189 A1 | * | 3/2002 | Ishikawa | 257/59 |
| 2002/0117668 A1 | * | 8/2002 | Kim | 257/59 |
| 2003/0109086 A1 | * | 6/2003 | Arao | 438/149 |

FOREIGN PATENT DOCUMENTS

| | | |
|---|---|---|
| JP | 2000-066234 | 3/2000 |
| JP | 2000-214484 | 8/2000 |
| JP | 2002-294451 | 10/2002 |
| JP | 2002-299264 | 10/2002 |
| JP | 2003-306400 | 10/2003 |
| JP | 2003-309268 | 10/2003 |
| KR | 10 0218500 B1 | 10/1999 |
| KR | 2000-0061176 A | 10/2000 |
| KR | 2004-0037889 A | 8/2004 |

* cited by examiner

*Primary Examiner* — Michelle Estrada
(74) *Attorney, Agent, or Firm* — Cantor Colburn LLP

(57) ABSTRACT

The present invention relates to a TFT, a TFT array panel, and a method of manufacturing the TFT array panel. A method of manufacturing the TFT array panel includes the steps of forming a first electrode and a second electrode that are separated from each other on a substrate, forming a silicon layer including amorphous silicon and polycrystalline silicon on the substrate, forming a semiconductor by patterning the silicon layer, forming a gate insulating layer on the semiconductor, forming a third electrode that is opposite to the semiconductor on the gate insulating layer, forming a passivation layer on the third electrode, and forming a pixel electrode on the passivation layer. The TFT array panel has high mobility because the TFT include polycrystalline silicon at the channel region of the TFT.

9 Claims, 28 Drawing Sheets

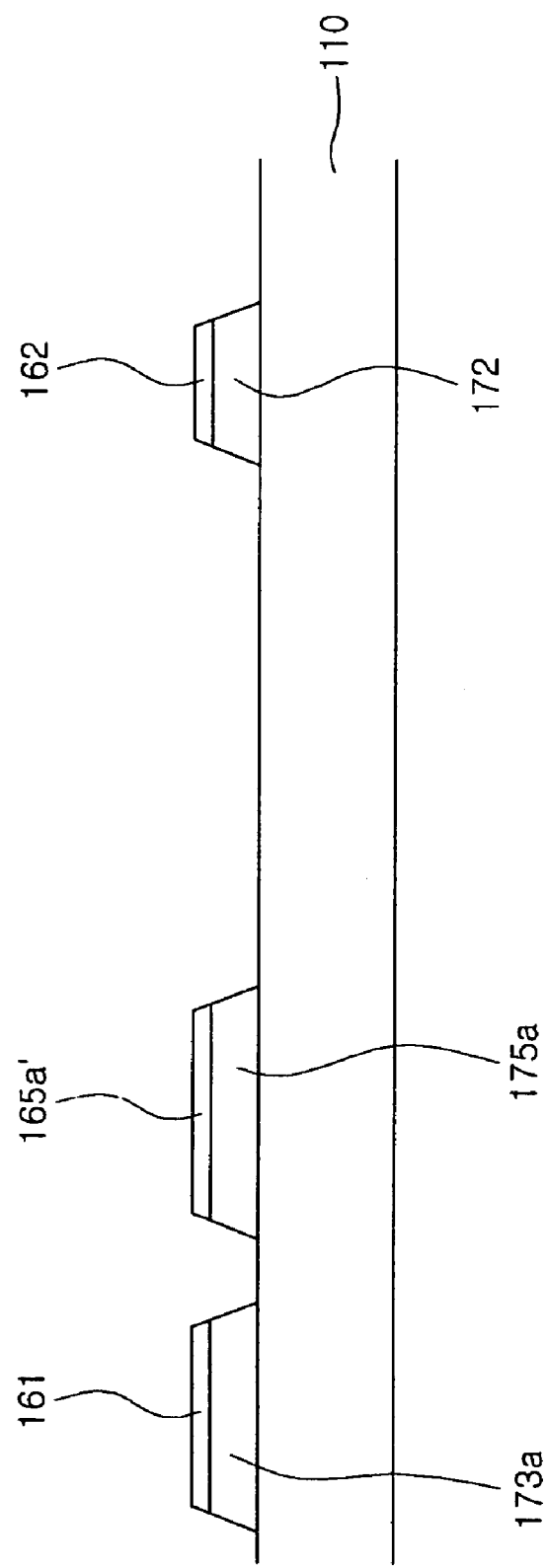

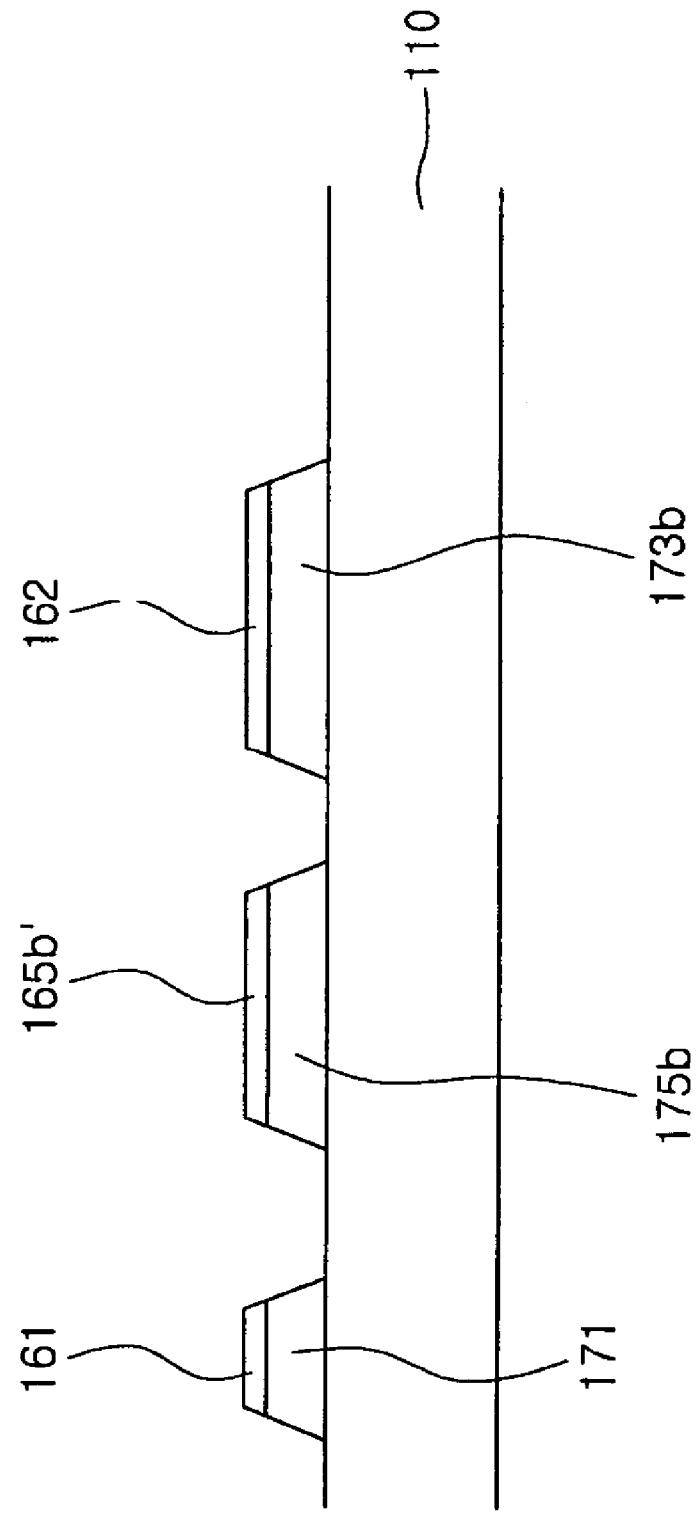

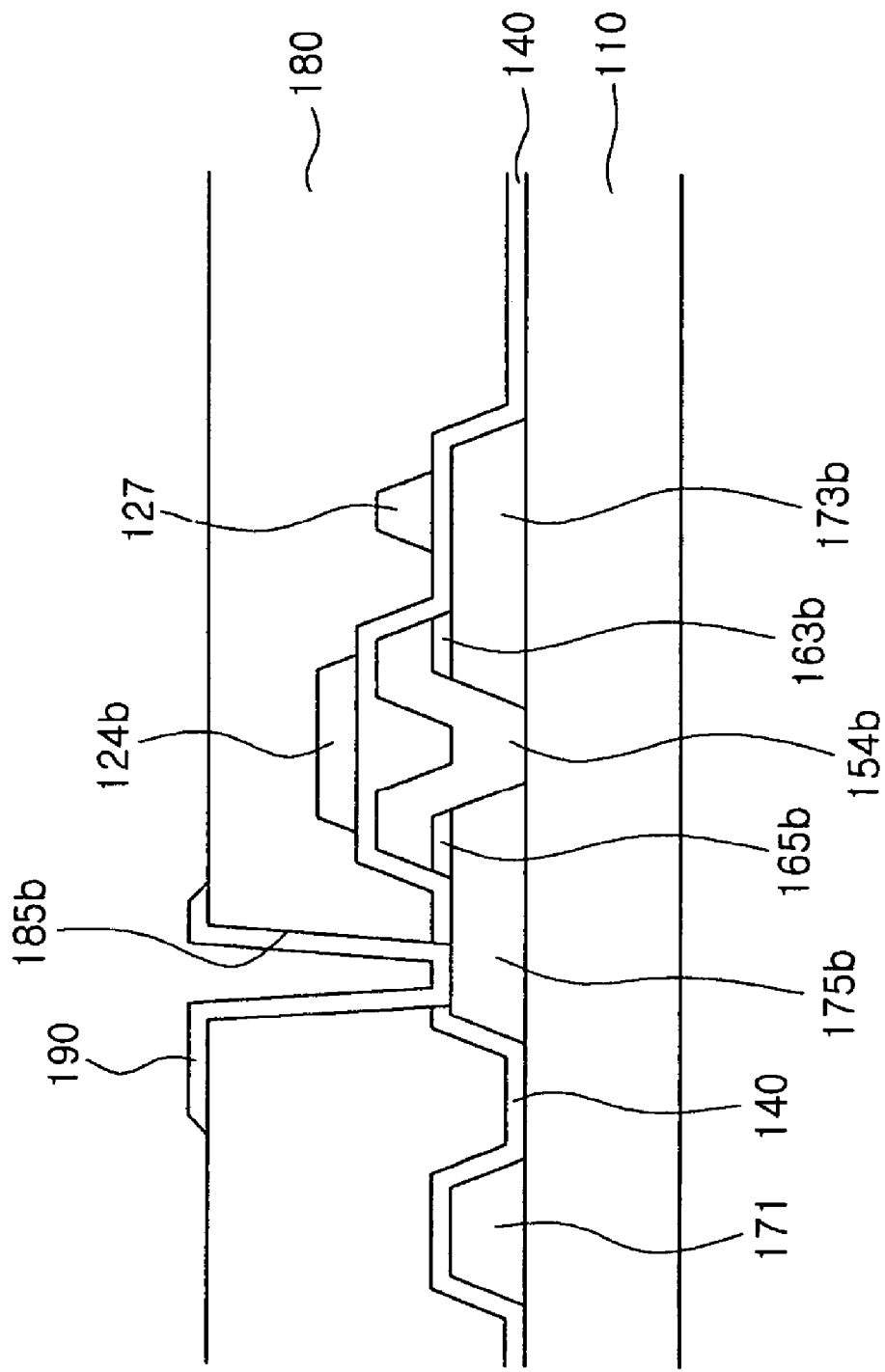

THIN FILM TRANSISTOR, THIN FILM TRANSISTOR PANEL, AND METHOD OF MANUFACTURING THE SAME

REFERENCE TO RELATED APPLICATIONS

This application claims priority to Korean Patent Application No. 2005-0021014, filed on Mar. 14, 2005, and all the benefits accruing therefrom under 35 U.S.C. §119, and the contents of which in its entirety are herein incorporated by reference.

BACKGROUND OF THE INVENTION (a) Field of the Invention

The present invention relates to a thin film transistor (TFT), a TFT array panel, and a method of manufacturing the TFT array panel.

(b) Description of the Related Art

There are two types of silicon depending on their crystal state. One is amorphous silicon and the other is crystalline silicon.

Amorphous silicon is popularly used to form semiconductors of TFTs employed in a display device using a glass substrate with a relatively low melting point. This is because amorphous silicon can be thinly deposited on the substrate at a low temperature.

However, amorphous silicon has a problem of low electric mobility. Because of such a problem, it may be unsuitable to apply it to semiconductors of large size display devices.

The problem of the low electric mobility can be overcome by using polycrystalline silicon instead of amorphous silicon. Polycrystalline silicon has good electrical characteristics, such as high electric mobility, better performance in a high frequency operation, and less leakage current.

Polycrystalline silicon is commonly obtained by laser annealing of amorphous silicon such as excimer laser annealing technology or sequential lateral solidification technology. Accordingly, process cost for the display panel increases. Also, in this case, it is difficult to obtain polycrystalline silicon with uniform crystallinity over the entire display panel.

SUMMARY OF THE INVENTION

The present invention provides a display panel that is produced with low production cost, whilst showing uniform characteristics over the entire area of the panel.

The present invention also provides a method of manufacturing such a display panel.

According to an aspect of the present invention, a TFT includes a first electrode and a second electrode that are formed on a substrate and are separated from each other, a semiconductor that is formed on the first and second electrodes and has amorphous silicon and polycrystalline silicon, a first insulating layer formed in the semiconductor, and a third electrode that is formed on the first insulating layer and is placed on the semiconductor.

Here, the ratio of the polycrystalline silicon with respect to the amorphous silicon in the semiconductor is highest at a first surface of the semiconductor near the third electrode, and it may increase towards the first surface of the semiconductor from the bottom. A size of each grain of polycrystalline silicon in the semiconductor may be more than 200Å.

The TFT may further include a first ohmic contact and a second ohmic contact that are individually formed between the first electrode and the semiconductor, and between the second electrode and the semiconductor. The first and second ohmic contacts may include amorphous silicon doped with impurities, while the semiconductor may include silicon.

The TFT may further include a second insulating layer that is formed between the semiconductor and the first insulating layer. The second insulating layer may have a planar shape that is substantially the same as that of the semiconductor, or it may cover the entire portion of the semiconductor.

According to another aspect of the present invention, a TFT array panel includes a substrate, a first TFT formed on the substrate, and a pixel electrode connected to the first TFT.

In this structure, the first TFT includes a semiconductor with a first surface and a second surface that are placed opposite to each other, a first electrode that is overlapped with the semiconductor and is in contact with the first surface of the semiconductor, a second electrode that is overlapped with the semiconductor while being in contact with the first surface of the semiconductor and is connected with the pixel electrode, a first insulating element that is formed on the second surface of the semiconductor, and a third electrode formed on the first insulating element and disposed to overlap the semiconductor.

The semiconductor includes amorphous silicon and polycrystalline silicon. The ratio of the polycrystalline silicon with respect to the amorphous silicon in the semiconductor is highest at the second surface. The ratio of the polycrystalline silicon with respect to the amorphous silicon in the semiconductor may increase towards the second surface from the first surface.

A size of each grain of polycrystalline silicon in the semiconductor may be more than 200 Å, and the first surface of the semiconductor may be closer from the substrate than the second surface.

The first TFT may further include a first ohmic contact and a second ohmic contact that are individually formed between the semiconductor and the first electrode and between the semiconductor and the second electrode. The semiconductor may include silicon, while the first and second ohmic contacts may include amorphous silicon doped with impurities.

The TFT array panel may further include a second insulating element that is formed between the semiconductor and the first insulating element. The second insulating element may have a planar shape that is substantially the same as that of the semiconductor, or it may cover the entire portion of the semiconductor.

The TFT array panel may further include a common electrode that is opposite to the pixel electrode, and it may further include an organic light emitting element or a liquid crystal layer between the pixel electrode and the common electrode.

According to still another aspect, a method of manufacturing a TFT array panel including the steps of (A) forming a first electrode and a second electrode that are separated from each other on a substrate, (B) forming a silicon layer including amorphous silicon and polycrystalline silicon on the substrate, (C) forming a semiconductor by patterning the silicon layer, (D) forming a gate insulating layer on the semiconductor, (E) forming a third electrode to overlap the semiconductor on the gate insulating layer, (F) forming a passivation layer on the third electrode, and (G) forming a pixel electrode on the passivation layer.

The silicon layer may be formed by chemical vapor deposition (CVD) or sputtering. The step (B) may include a chemical vapor deposition process that is performed while utilizing a mixture gas of a silicon-containing gas and hydrogen, as a reaction gas. In this case, a preferable volume of the silicon-containing gas may be less than 0.05% of the total volume of the reactive gas, and the chemical vapor deposition process may be performed at a deposition temperature of 250° C. to 370° C. The silicon-containing gas may include at least one of $SiH_4$, $SiH_2Cl_2$, and $SiH_2F_2$.

The step (B) may include a sputtering process that is performed utilizing a silicon target. In this case, the sputtering process may include a step of forming a seed layer by utilizing a mixture gas of an inactive gas and hydrogen, and a step of introducing only the inactive gas in a reaction chamber to grow silicon on the seed layer. In addition, the sputtering process may be performed at a deposition temperature of 250° C. to 370° C. under a working pressure of 0 mTorr to 5.5 mTorr. The inactive gas may be argon gas.

The manufacturing method of the TFT array panel may further include a step of forming an insulating element between the semiconductor and the gate insulating layer.

In addition, the manufacturing method of the TFT array panel may further include a step of forming a barrier with an opening that is placed on the pixel electrode, a step of forming an organic light emitting element in the opening, and a step of forming a common electrode on the organic light emitting element.

BRIEF DESCRIPTION OF THE DRAWINGS

The above objects and other advantages of the present invention will become more apparent by describing the preferred embodiments thereof in more detail with reference to the accompanying drawings.

FIG. 10A and FIG. 10B are schematic cross-sectional views cut along XA-XA' and XB-XB' of FIG. 9.

FIG. 19A and FIG. 19B are schematic cross-sectional views cut along XVIIIA-XVIIIA' and XVIIIB-XVIIIB' of FIG. 18.

DETAILED DESCRIPTION OF THE PREFERRED EMBODIMENTS

Figure 1:
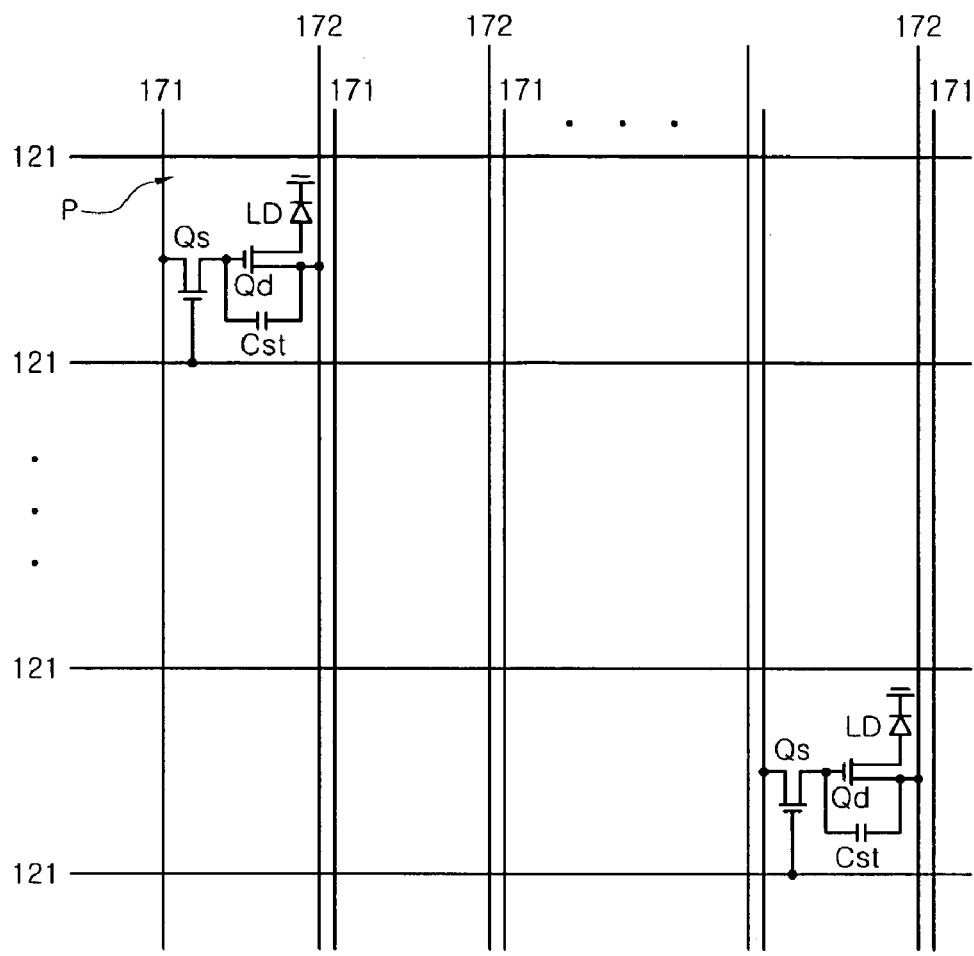
FIG. 1 is an equivalent circuit view of an OLED according to an embodiment of the present invention.

Preferred embodiments of the present invention are now described more fully hereinafter with reference to the accompanying drawings, in which preferred embodiments of the invention are shown. The present invention may, however, be embodied in different forms and thus the present invention should not be construed as being limited to the embodiments set forth herein. Rather, these embodiments are provided so that this disclosure will be thorough and complete, and will fully convey the scope of the invention to those skilled in the art.

In the drawings, the thickness of the layers, films, and regions are exaggerated for clarity. Like numerals refer to like elements throughout. When an element such as a layer, film, region, or substrate is referred to as being "on" another element, it can be directly on the other element or intervening elements may also be present.

Hereinafter, organic light emitting displays (OLEDs) according to preferred embodiments of the present invention will be described with reference to the accompanying drawings.

First, an equivalent circuit of an OLED according to an embodiment of the present invention is described in detail with reference to FIG. 1.

Referring to FIG. 1, the OLED of this embodiment includes a plurality of signal lines and a plurality of pixels P connected thereto and arranged substantially in a matrix.

The signal lines includes a plurality of gate lines 121 for transmitting gate signals (also referred to as "scanning signals"), a plurality of data lines 171 for transmitting data signals, and a plurality of driving voltage lines 172 for transmitting driving voltages. The gate lines 121 extend substantially in a row direction and are substantially parallel to each other, while the data lines 171 and the driving voltage lines 172 extend substantially in a column direction and are substantially parallel to each other.

Each pixel P has an organic light emitting diode LD, a driving transistor $Q_d$, a capacitor $C_{st}$, and a switching transistor $Q_s$.

The driving transistor $Q_d$ has three terminals: a control terminal connected to the switching transistor $Q_s$; an input terminal connected to one of the driving voltage lines 172; and an output terminal connected to the organic light emitting diode LD.

The organic light emitting diode LD has an anode connected to the output terminal of the driving transistor $Q_d$ and a cathode connected to a common voltage $V_{com}$. The organic light emitting diode LD produces light in response to a current supplied from the driving transistor $Q_d$. The luminance of light emitted from the organic light emitting diode LD varies depending on the intensity of the supplied current. Accordingly, desired image display can be achieved by controlling the intensity of the current to be applied to the organic light emitting diode LD. Here, the current is greatly dependant upon a voltage between the gate terminal and the source terminal of the driving transistor $Q_d$.

The switching transistor $Q_s$ has three terminals: a control terminal connected to one of the gate lines 121; an input terminal connected to one of the data lines 171; and an output terminal connected to the control terminal of the driving transistor $Q_d$. In accordance with the gate signal applied to the gate line 121, the switching transistor $Q_s$ transmits the data signal, which is applied to the data line 171 and to the driving transistor $Q_d$.

The capacitor $C_{st}$ is connected between the control terminal and the input terminal of the driving transistor $Q_d$. The capacitor $C_{st}$ stores the data signal applied to the control terminal of the driving transistor $Q_d$ as a charge, and holds the stored charge.

Hereinafter, the structure of the above-mentioned OLED will be described in more detail with reference to FIG. 2 through FIG. 8, and FIG. 1 again.

Figure 2:
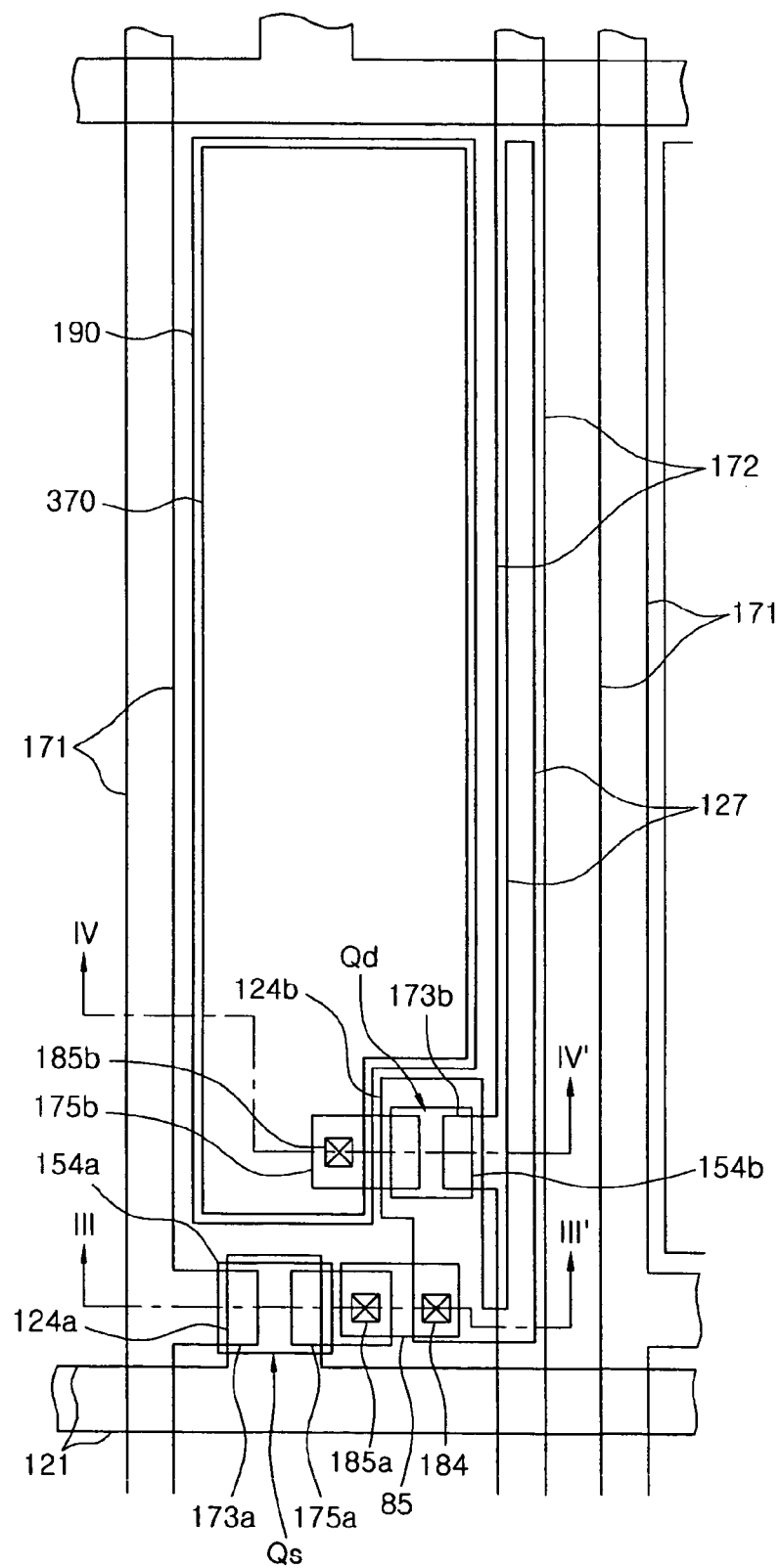
FIG. 2 is a layout view of an OLED according to an embodiment of the present invention.
Figure 3:
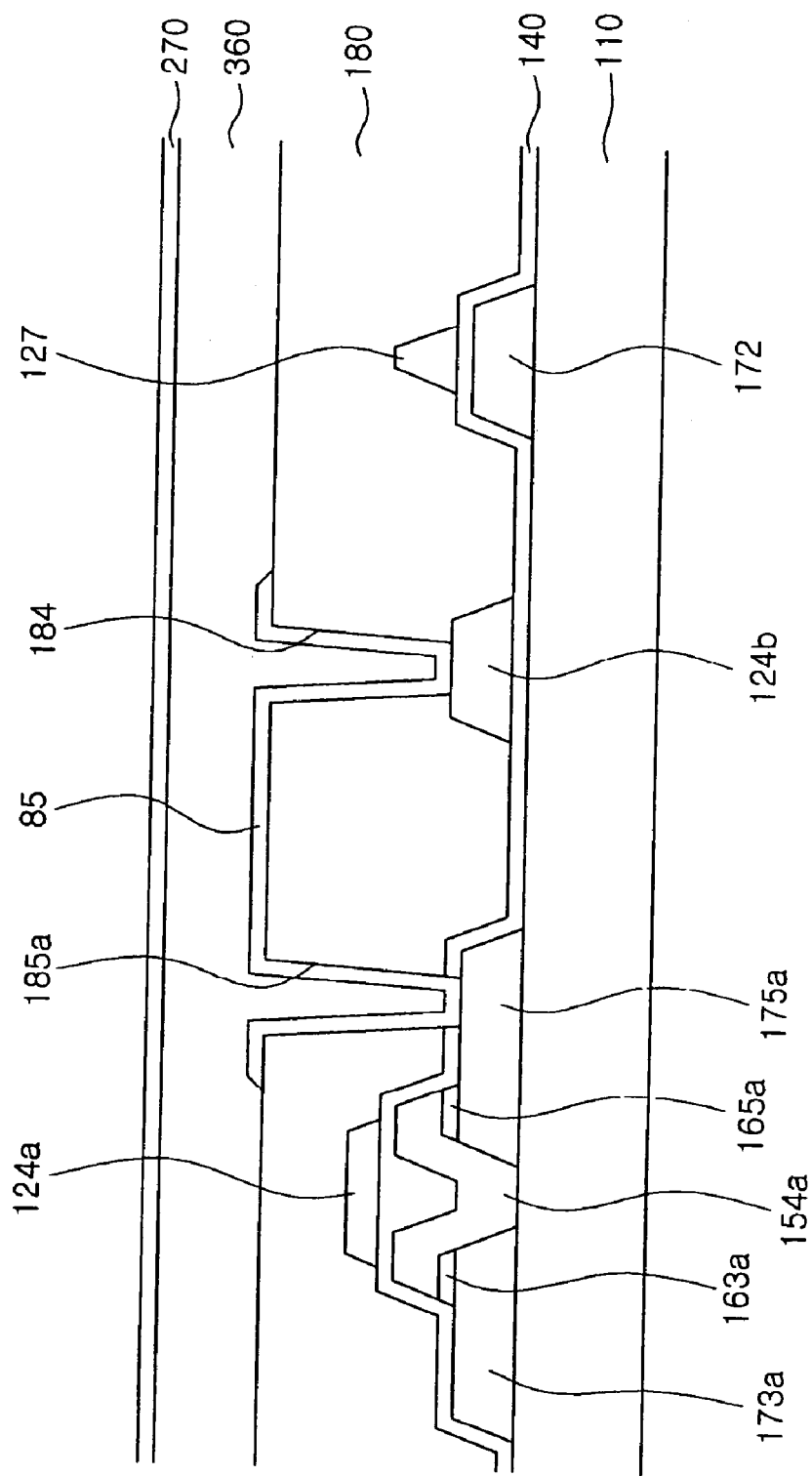
FIG. 3, FIG. 5, and FIG. 7 are cross-sectional views cut along III-III' of FIG. 2 and illustrate alternate embodiments of the OLED of FIG. 2.
Figure 4:
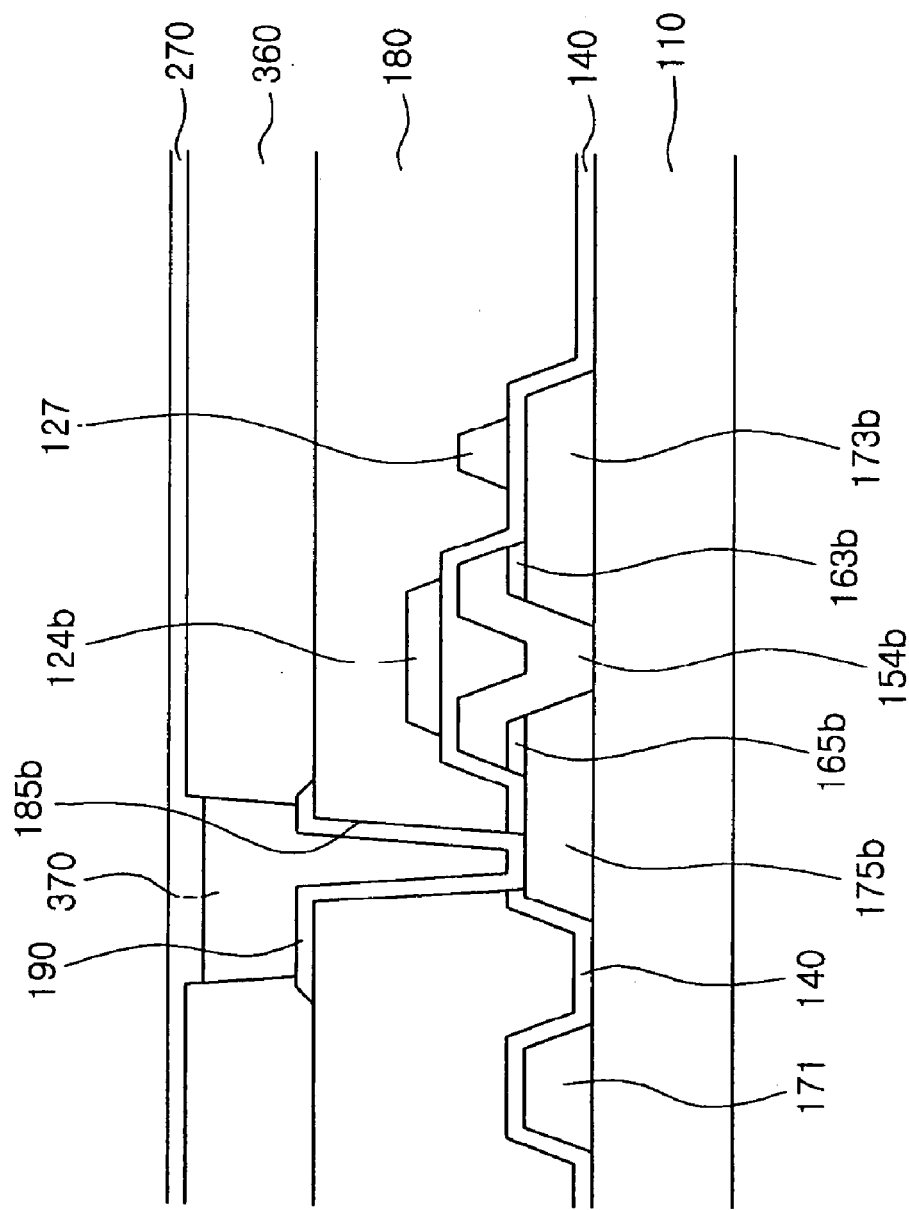
FIG. 4, FIG. 6, and FIG. 8 are cross-sectional views cut along IV-IV' of FIG. 2 and illustrate alternate embodiments of the OLED of FIG. 2.
Figure 5:
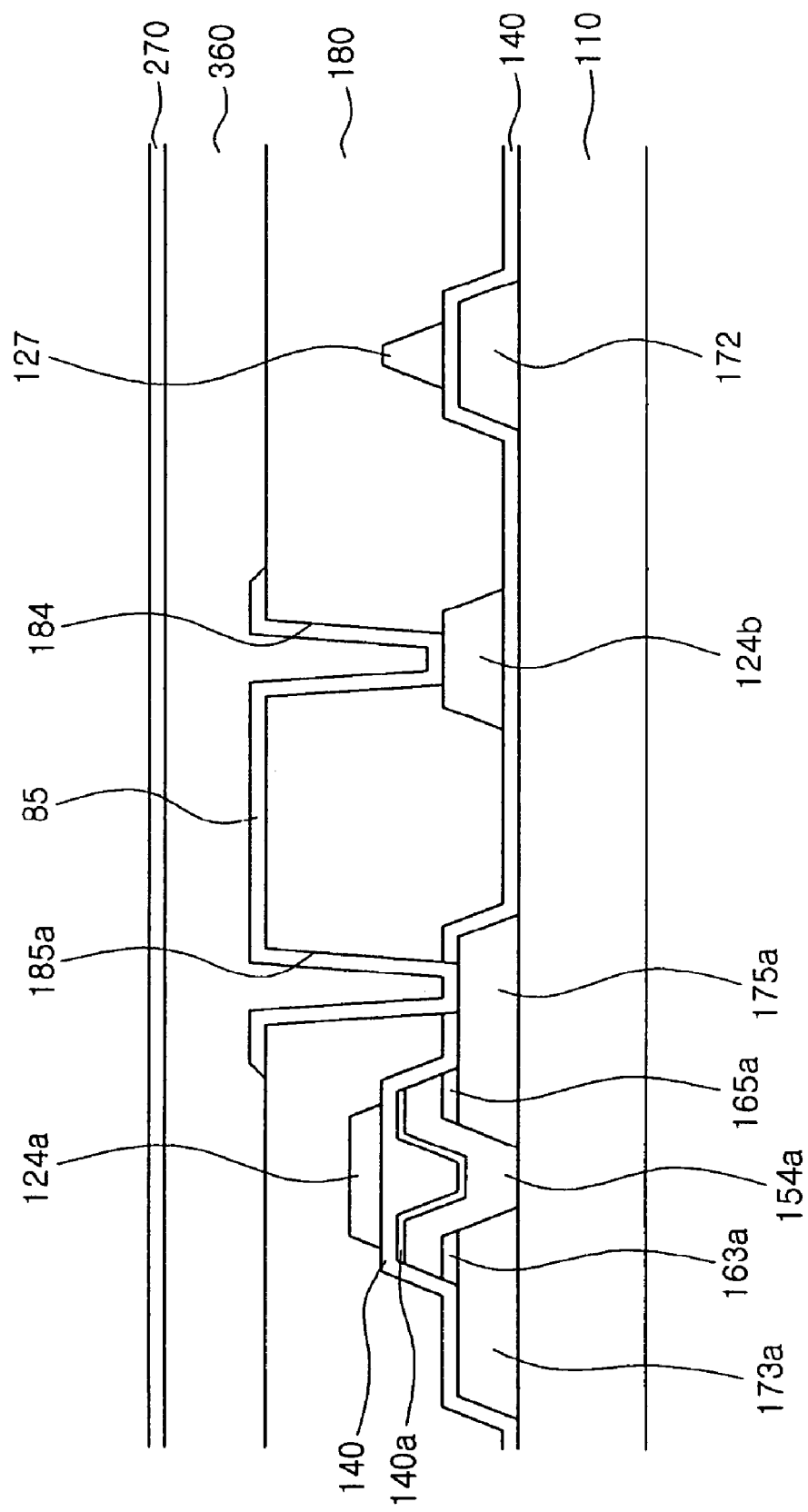
Figure 6:
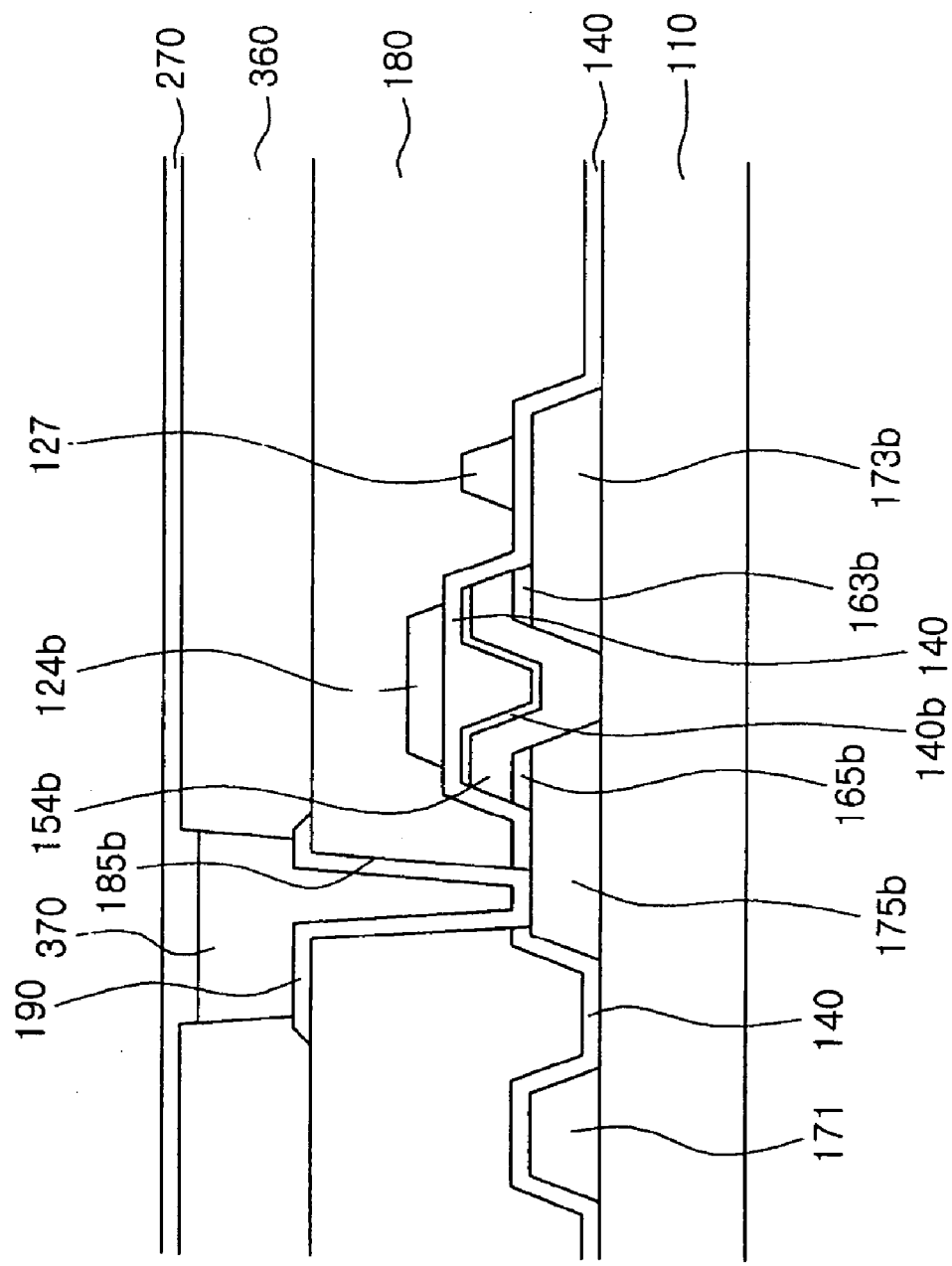
Figure 7:
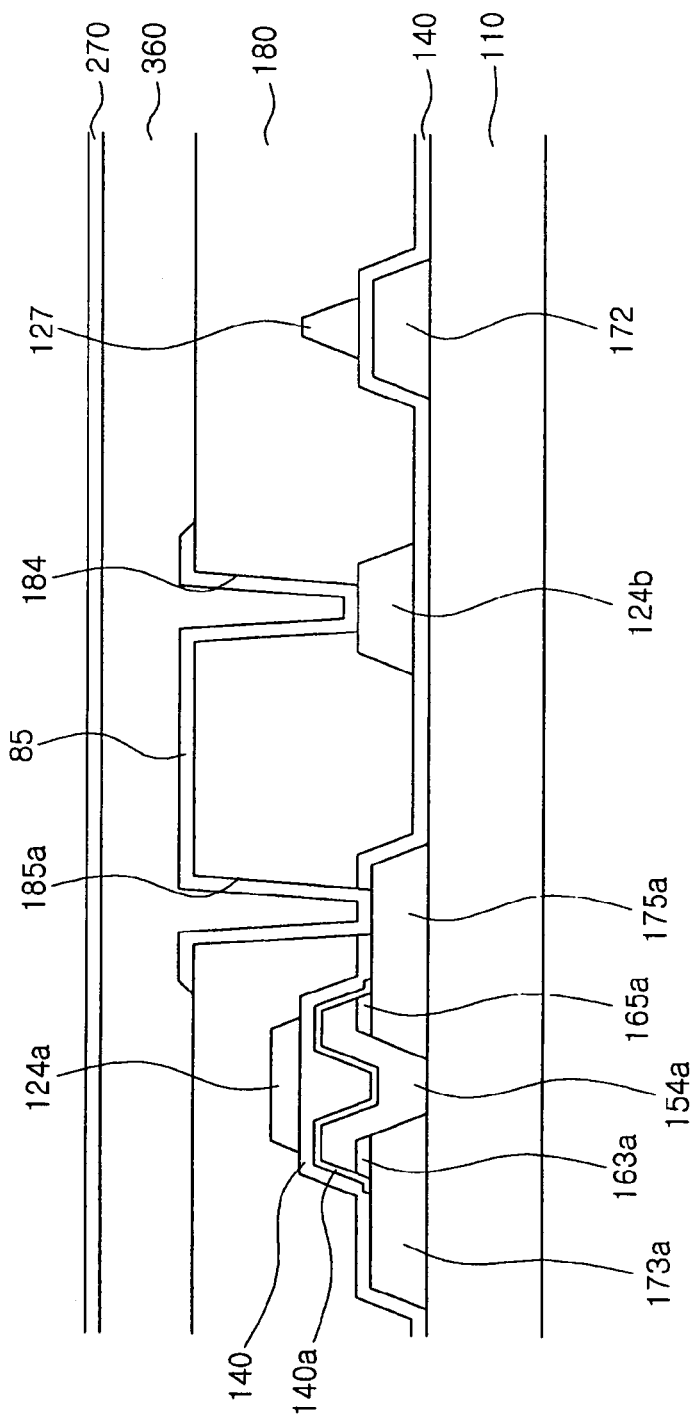

FIG. 2 is a layout view of an OLED according to an embodiment of the present invention, FIG. 3, FIG. 5, and FIG. 7 are cross-sectional views cut along III-III' of FIG. 2, and FIG. 4, FIG. 6, and FIG. 8 are cross-sectional views cut along IV-IV' of FIG. 2. FIGS. 3-8 illustrate alternate embodiments of the OLED of FIG. 2.

Referring to FIG. 2 through FIG. 4, a plurality of data conductors including the plurality of data lines 171, the plurality of driving voltage lines 172, and a plurality of pairs of first and second output electrodes 175a and 175b, are formed on a transparent insulating substrate 110 made of glass or the like.

The data lines 171 for transmitting the data signals extend substantially in a vertical direction to intersect the gate lines 121. An end portion (not shown) of each data line 171 may be formed wider than other portions of the same data line 171, to be connected to a different layer or an external device. In the case that data drivers (not shown) for generating the data signals are integrated into the substrate 110, the data lines 171 may be are directly connected to the data drivers. Each data line 171 includes a plurality of first input electrodes 173a protruding in a horizontal direction. A side of each first input electrode 173a faces a side of one of the first output electrodes 175a.

The driving voltage lines 172 for transmitting the driving voltages extend substantially in a vertical direction and are placed near the respective data lines 171. Each driving voltage line 172 includes a plurality of second input electrodes 173b protruding in a horizontal direction. A side of each second input electrode 173b faces a side of one of the second output electrodes 175b.

The data conductors 171, 172, 175a, and 175b may be made of a refractory metal such as molybdenum (Mo), chrome (Cr), titanium (Ti), or tantalum (Ta), or any of their alloys. They may also be configured as a multi-layered structure, in which at least two conductive layers (not shown) having different physical properties are included. In such a structure, one of the two conductive layers is made of a refractory metal, and the other is made of a low resistivity metal such as an aluminum—(Al) containing metal, a silver—(Ag) containing metal, or a cooper—(Cu) containing metal, in order to reduce delay of the signals or voltage drop in the data conductors 171, 172, 175a, and 175b. A desirable example of the multi-layered structure is a lower layer made of Al or an Al alloy and an upper layer made of Cr, Mo, or a Mo alloy.

All lateral sides of the data conductors 171, 172, 175a, and 175b preferably slope between about 30° and about 80° relative to the surface of the substrate 110.

A plurality of island-shaped ohmic contacts 163a, 163b, 165a, and 165b are formed on the data conductors 171, 172, 175a, and 175b, respectively. The ohmic contacts 163a, 163b, 165a, and 165b are made of silicide or N+ hydrogenated amorphous silicon (abbreviated to "a-Si") that is highly doped with N-type impurities such as phosphorus (P).

A plurality of semiconductors 154a are formed on the ohmic contacts 163a and 165a, and a plurality of semiconductors 154b are formed on the ohmic contacts 163b and 165b. As shown in FIG. 3, each semiconductor 154a is connected to the first input electrode 173a and the first output electrode 175a through the ohmic contacts 163a and 165a, and is partially overlapped with the first input electrode 173a and the first output electrode 175a. Meanwhile, as shown in FIG. 4, each semiconductor 154b is connected to the second input electrode 173b and the second output electrode 175b through the ohmic contacts 163b and 165b, and is partially overlapped with the second input electrode 173b and the second output electrode 175b.

The semiconductors 154a and 154b contains microcrystalline silicon or amorphous silicon, and polycrystalline silicon. The lower portions of the semiconductors 154a and 154b mainly consist of microcrystalline silicon or amorphous silicon, while the upper portions (particularly, portions near the top surfaces) mainly consist of polycrystalline silicon. Alternately, in each semiconductor, the amount of polycrystalline silicon may increase toward the top surface of the semiconductor from the bottom. A preferable size of each polycrystalline silicon grain is more than about 200 Å.

Figure 8:
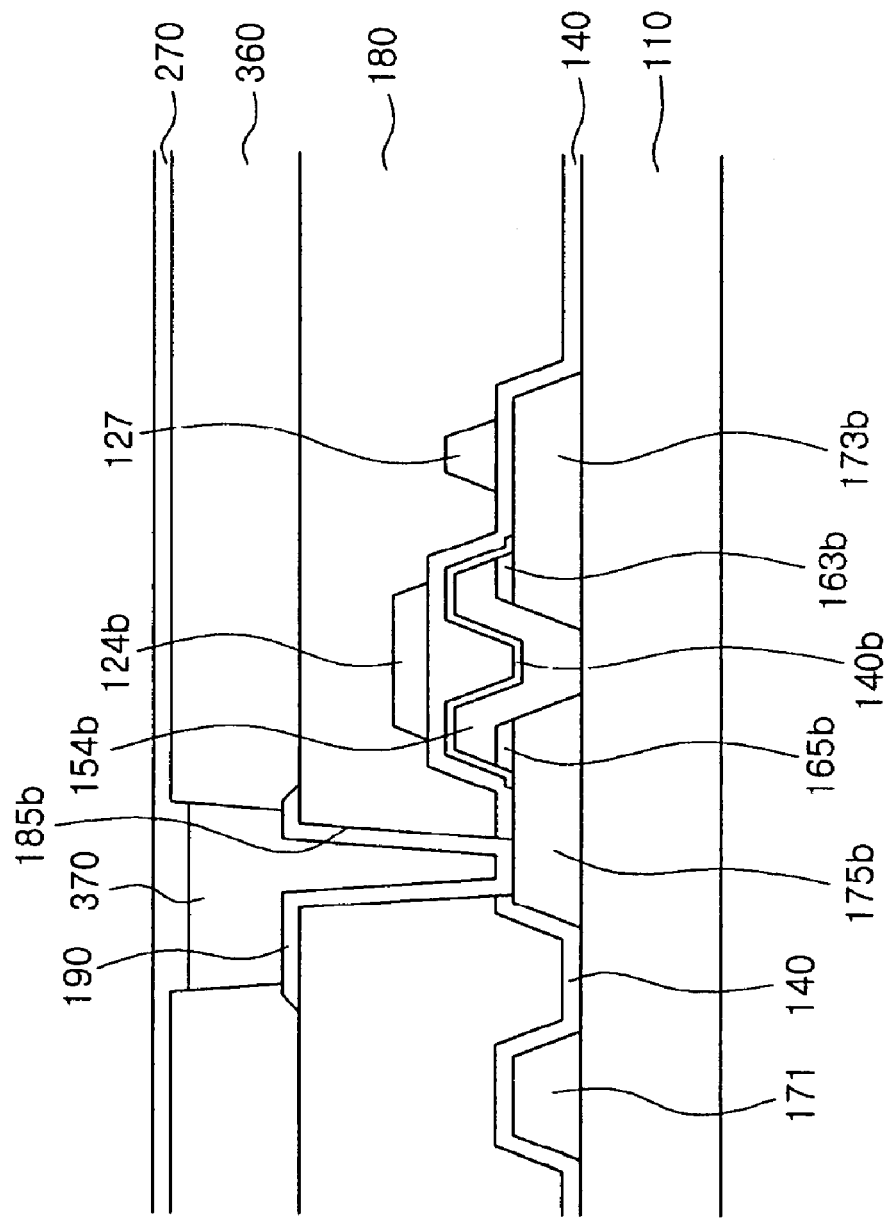

A gate insulating layer 140 made of silicon nitride ($SiN_x$) or silicon oxide ($SiO_2$), is formed on the semiconductors 154a and 154b. In an alternate embodiment of the OLED of FIG. 2 shown in FIG. 5 and FIG. 6, a plurality of insulating elements 140a and 140b may be formed between the gate insulating layer 140 and the semiconductors 154a and 154b. In this structure, the insulating elements 140a and 140b have planar shapes that are substantially the same as those of the semiconductors 154a and 154b. However, in yet another embodiment, the insulating elements 140a and 140b may be formed to completely cover the semiconductors 154a and 154b, as shown in FIG. 7 and FIG. 8.

Returning to FIGS. 2-4, a plurality of gate conductors including the plurality of gate lines 121 and a plurality of second control electrodes 124b are formed on the gate insulating layer 140.

The gate lines 121 for transmitting the gate signals extend substantially in a horizontal direction to cross the data lines 171. Each gate line 121 includes a plurality of first control electrodes 124a protruding toward the respective semiconductors 154a. Each first control electrode 124a is partially overlapped with the semiconductor 154a, the first input electrode 173a, and the first output electrode 175a. An end portion (not shown) of each gate line 121 may be formed wider than other portions of the same gate line 121 in order to be connected to a different layer or an external device.

Each second control electrode 124b consists of an expansion with a relatively large dimension, a vertical portion extending downward from the expansion, and a horizontal portion connecting the vertical portion and a storage electrode line 127 that is placed to the right of the second control electrode 124b and extends along the driving voltage line 172. The expansion of the second control electrode 124b is overlapped with the semiconductor 154b. Also, the expansion of the second control electrode 124b is partially overlapped with the second input electrode 173b and the second output electrode 175b. The storage electrode lines 127 are overlapped with the driving voltage lines 172, and the overlap portions become storage electrodes $C_{st}$.

A first control electrode 124a, a first input electrode 173a, and a first output electrode 175a form a switching TFT $Q_s$, along with a semiconductor 154a and a pair of ohmic contacts 163a and 165a. A channel of the switching TFT $Q_s$ is formed in the semiconductor 154a provided between the first input electrode 173a and the first output electrode 175a. A second control electrode 124b, a second input electrode 173b, and a second output electrode 175b form a driving TFT $Q_d$, along with a semiconductor 154b and a pair of ohmic contacts 163b and 165b. A channel of the driving TFT $Q_d$ is formed in the semiconductor 154b provided between the second input electrode 173b and the second output electrode 175b.

Particularly, the channels of the switching TFT $Q_s$ and the driving TFT $Q_d$ are formed near the top surfaces of the semiconductors 154a and 154b that are in contact with the gate insulating layer 140. These portions near the top surfaces consist of polycrystalline silicon with a good electrical property. Accordingly, the TFTs $Q_s$ and $Q_d$ formed in this manner have good TFT characteristics, compared to a different TFT having a semiconductor consisting of only amorphous silicon or having a semiconductor whose lower portion consists of polycrystalline silicon.

The gate conductors 121 and 124b are made of an Al-containing metal, a Ag-containing metal, a Cu-containing metal, a Mo-containing metal, Cr, Ti, Ta, or any of their alloys. They may be configured as a multi-layered structure, in which at least two conductive layers (not shown) having different physical properties are included. In such a structure, one of the two conductive layers is made of a low resistivity metal, such as an Al-containing metal, a Ag-containing metal, or a Cu-containing metal, in order to reduce delay of the signals or voltage drop in the gate conductors 121 and 124b. The other conductive layer is made of a material having good physical, chemical, and electrical contact properties with other materials such as indium tin oxide (ITO) and indium zinc oxide (IZO). For example, Mo, Cr, Ta, Ti, or any of their alloys may be used to form the same layer. Desirable examples of the combination of the two layers are a lower Cr layer and an upper Al (or Al alloy) layer, and a lower Al (or Al alloy) layer and an upper Mo (or Mo alloy) layer.

A passivation layer 180 is formed on the gate lines 121, the second control electrodes 124b, and the gate insulating layer 140. The passivation layer 180 is made of an inorganic insulator, an organic insulator, or a low dielectric insulator having a dielectric constant of below 4.0. Desirable examples of the low dielectric insulator are a-Si:C:O, a-Si:O:F, etc., produced by plasma enhanced chemical vapor deposition (PECVD). The organic insulator used to form the passivation layer 180 may have photosensitivity. A top surface of the passivation layer 180 may be flat. The passivation layer 180 may be configured as a double-layered structure including a lower inorganic insulator layer and an upper organic insulator layer. This structure has a good insulating property, and protects the exposed portions of the semiconductors 154a and 154b from damage.

The passivation layer 180 is provided with a plurality of contact holes 184, through which the first control electrodes 124b are exposed. A plurality of contact holes 185a and 185b are formed in the passivation layer 180 and the gate insulating layer 140 to expose the first and second output electrodes 175a and 175b, respectively.

A plurality of pixel electrodes 190 and a plurality of contact assistants 85 are formed on the passivation layer 180.

The pixel electrodes 190 and the contact assistants 85 are preferably made of a transparent conductor such as ITO or IZO, or a good reflective material such as Al, Ag, or any of their alloys.

Each pixel electrode 190 is physically and electrically connected to the second output electrode 175b through the contact hole 185b. Each contact assistant 85 is connected to first output electrode 175a and the second gate electrode 124b through the contact holes 185a and 184.

A barrier 360 made of an organic insulator or an inorganic insulator is formed on the passivation layer 180 and the pixel electrodes 190. The barrier 360 defines openings by surrounding the borders of the pixel electrodes 190 in the shape of a bank.

A plurality of organic light emitting elements 370 are formed on the electrodes 190. Each organic light emitting element 370 is formed in the opening delimited by the barrier 360.

Each organic light emitting element 370 may be configured as a multi-layered structure including an emitting layer (not shown) that produces light and subordinate layers (not shown) that are additionally provided to improve emission efficiency of the emitting layer. In the subordinate layers, an electron transport layer, a hole transport layer, an electron injecting layer, and a hole injecting layer are included. To improve emission efficiency of the emitting layer, the electron transport layer and the hole transport layer induce a balance of electrons and holes, while the electron injecting layer and the hole injecting layer enhance injection of the electrons and holes. These subordinate layers may be omitted.

A common electrode 270 is formed on the barrier 360 and the organic light emitting members 370. The common electrode 270 receives the common voltage and is made of a transparent conductor such as ITO or IZO, or a reflective metal such as calcium (Ca), barium (Ba), Cr, Al, or Ag.

Generally, a top emission type of OLED where light is emitted from the upper side of the emitting layer adopts a pixel electrode 190 made of an opaque material and a common electrode 270 made of a transparent material, while a bottom emission type of OLED where light is emitted from the lower side of the emitting layer adopts a pixel electrode 190 made of a transparent material and a common electrode 270 made of an opaque material.

A pixel electrode 190, an organic light emitting member 370, and a common electrode 270 form the organic light emitting diode LD shown in FIG. 1. Here, the pixel electrode 190 becomes an anode of the organic light emitting diode LD and the common electrode 270 becomes a cathode. Conversely, the pixel electrode 190 may be the cathode and the common electrode 270 may be the anode.

Each organic light emitting diode LD uniquely exhibits one of the three primary colors (red, green, and blue colors) depending on an organic material used to form the light emitting element 370, and the spatial sum of the primary colors is recognized as a desired color.

Hereinafter, a method of manufacturing the OLED shown in FIG. 2 through FIG. 4 will be described in detail with reference to FIG. 9 through FIG. 21B, and FIG. 2 through FIG. 8.

Figure 9:
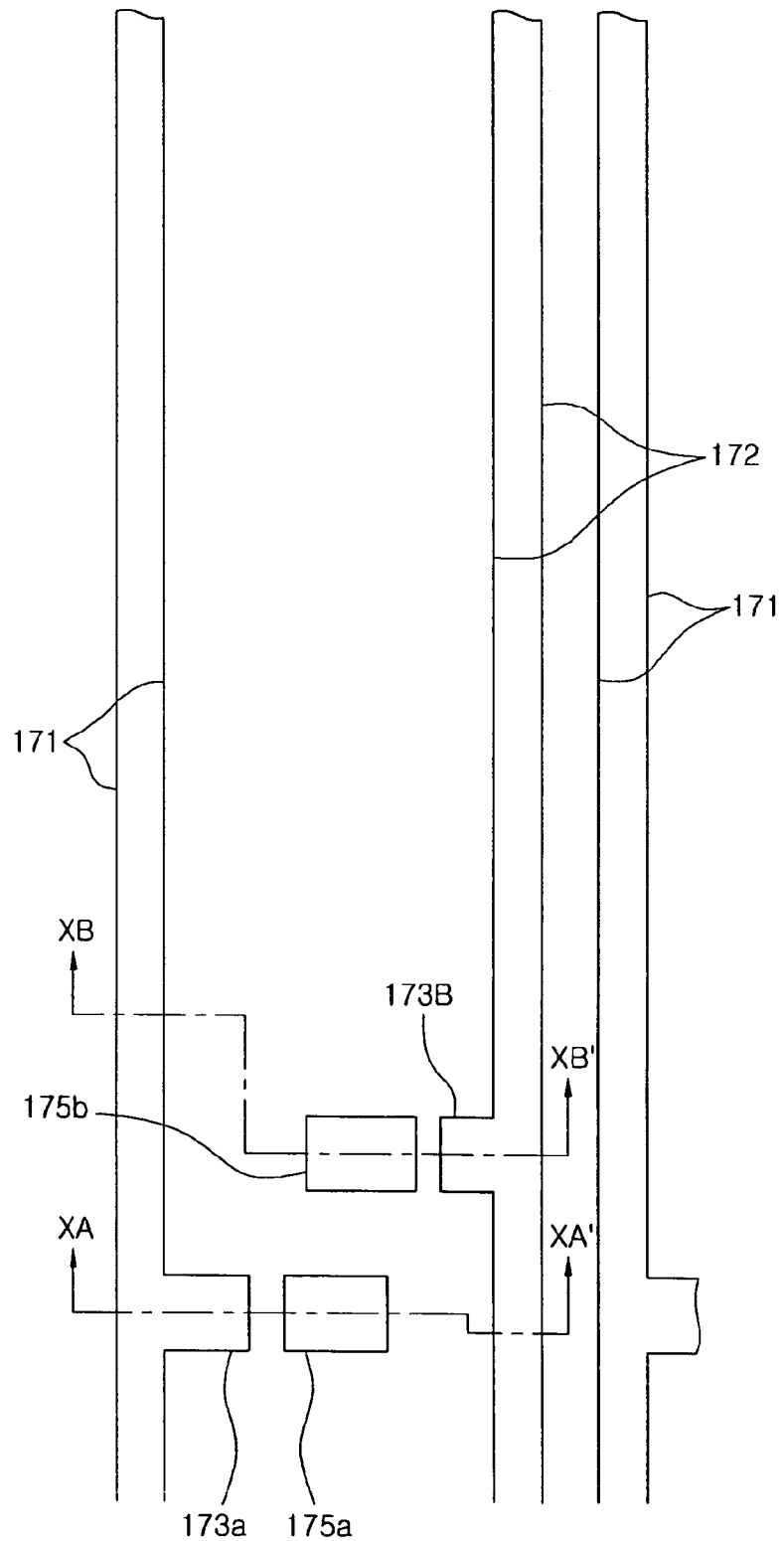
FIG. 9, FIG. 11, FIG. 14, FIG. 16, FIG. 18, and FIG. 20 are layout views for explaining the intermediate process steps to manufacture the OLED shown in FIG. 2 through FIG. 4.
Figure 11:
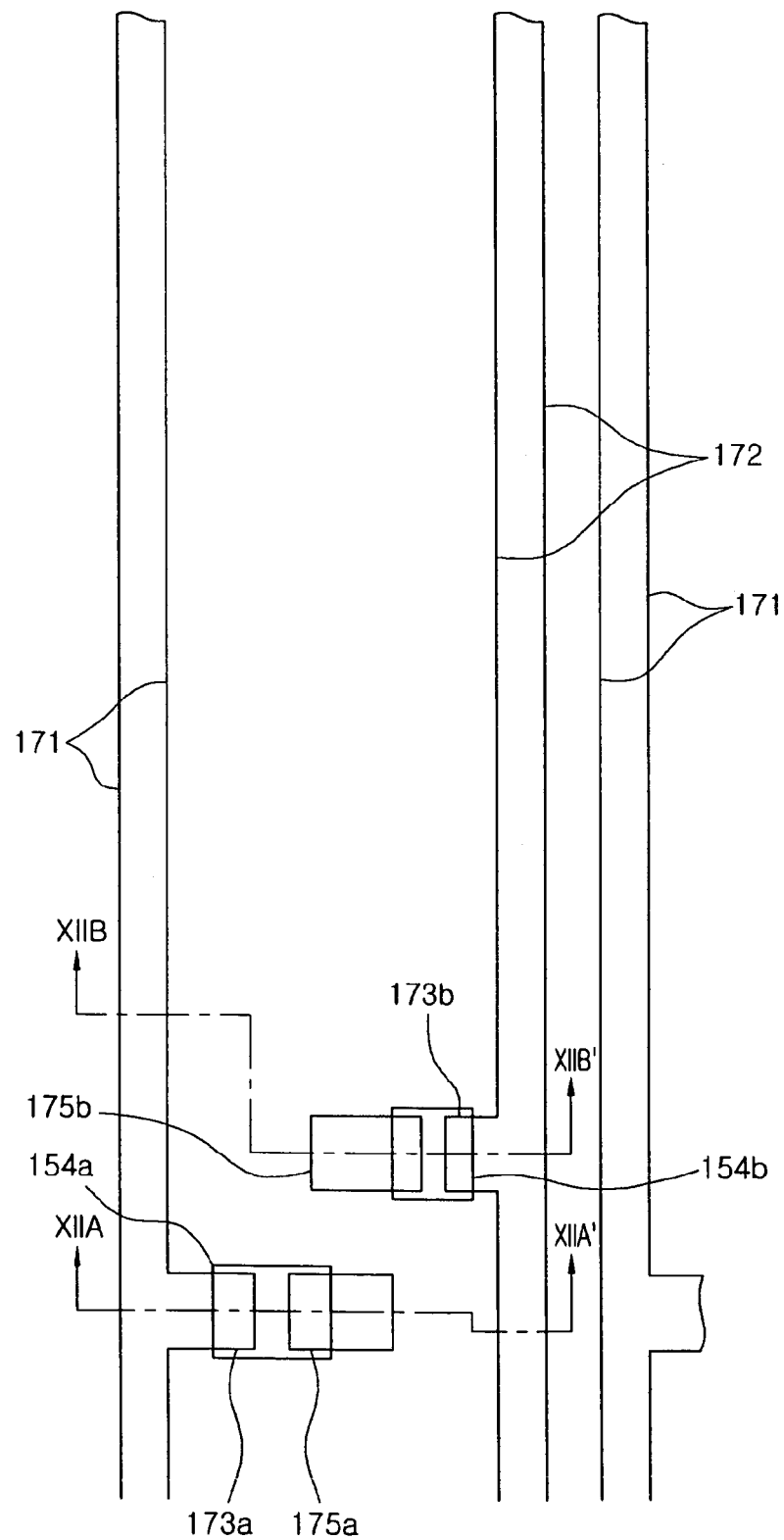
Figure 12A:
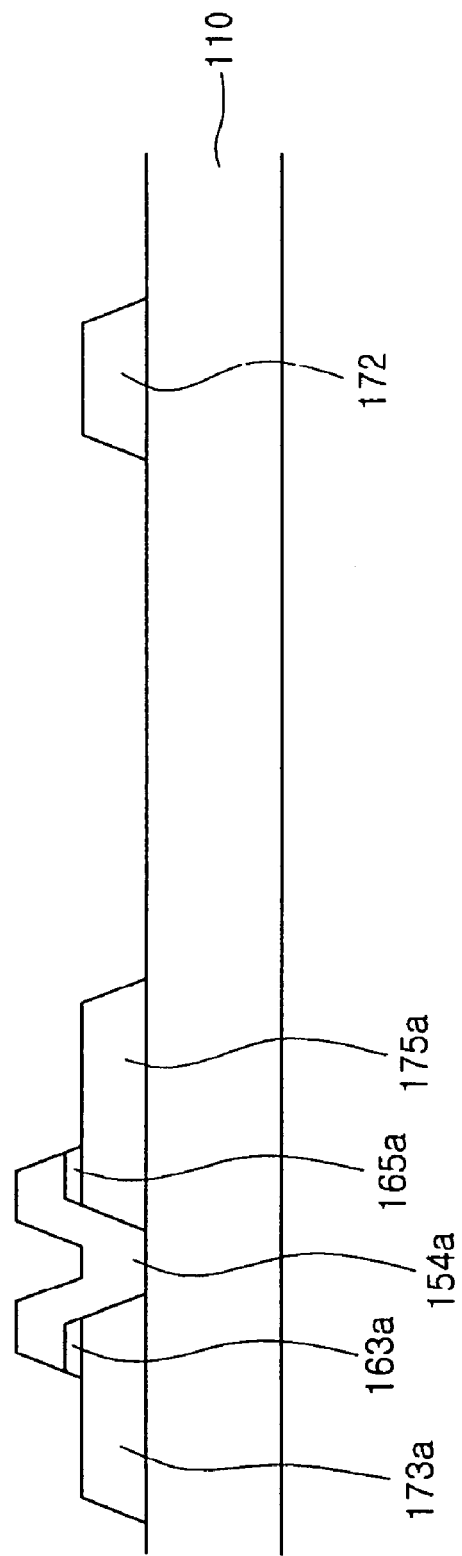
FIG. 12A and FIG. 12B are schematic cross-sectional views cut along XIIA-XIIA' and XIIB-XIIB' of FIG. 11.
Figure 12B:
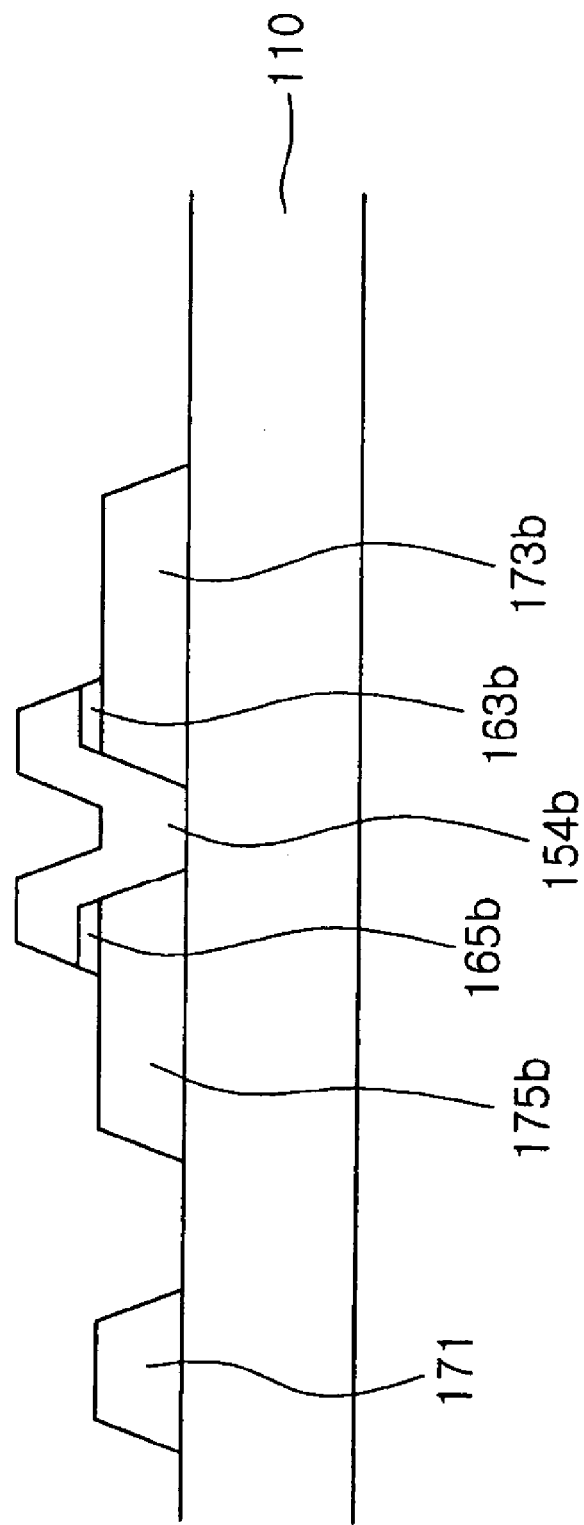
Figure 13:
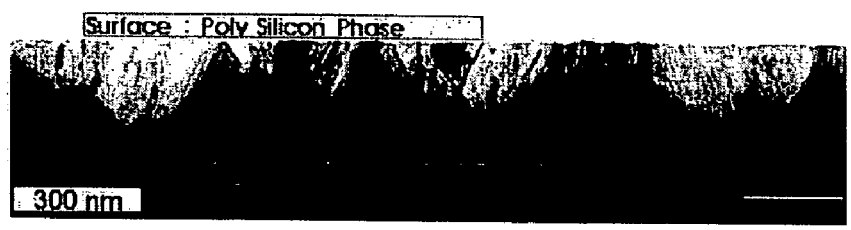
FIG. 13 is a photograph showing a vertical scheme of a semiconductor photographed by a transmission electron microscope (TEM).
Figure 14:
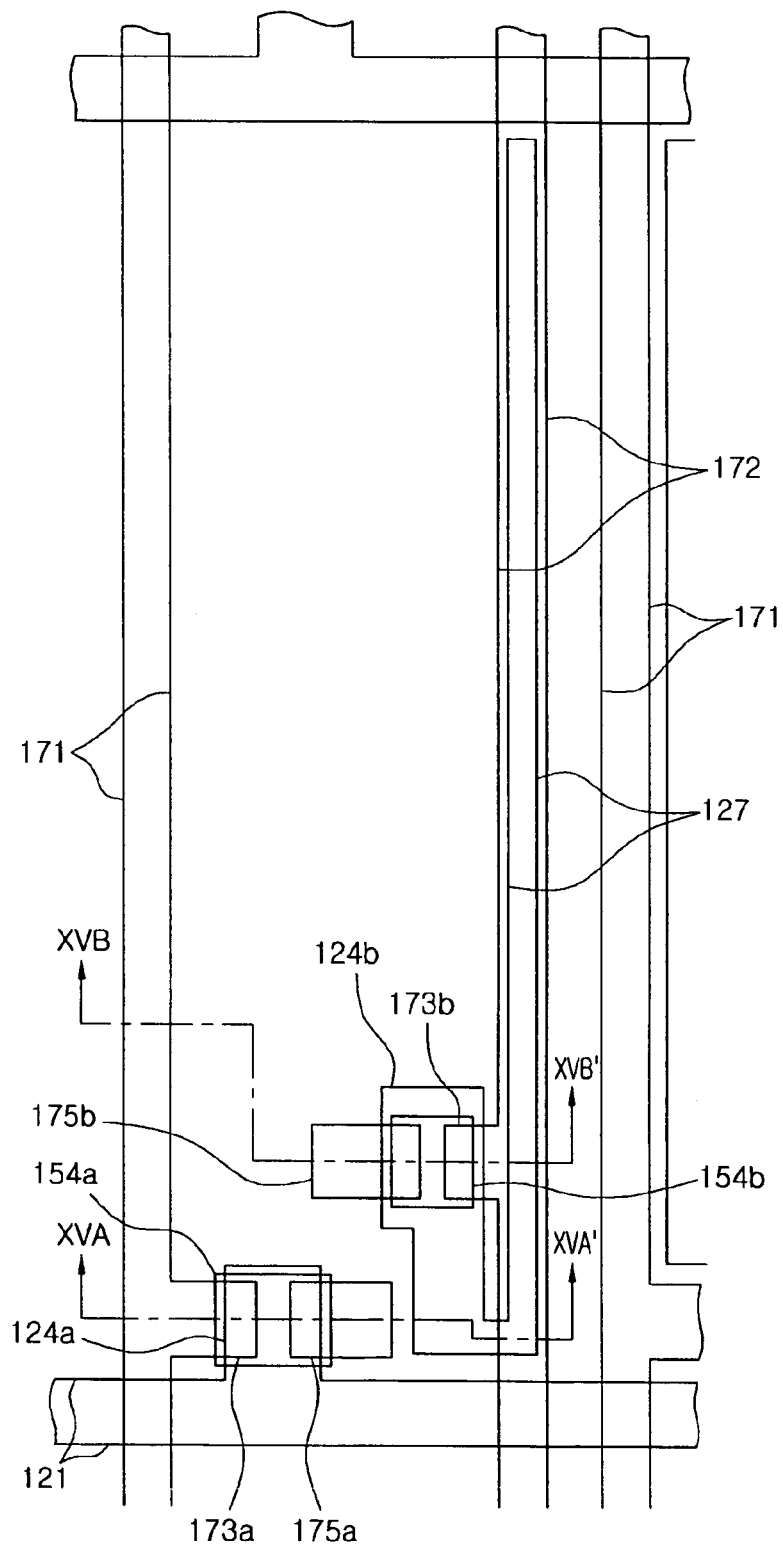
Figure 15A:
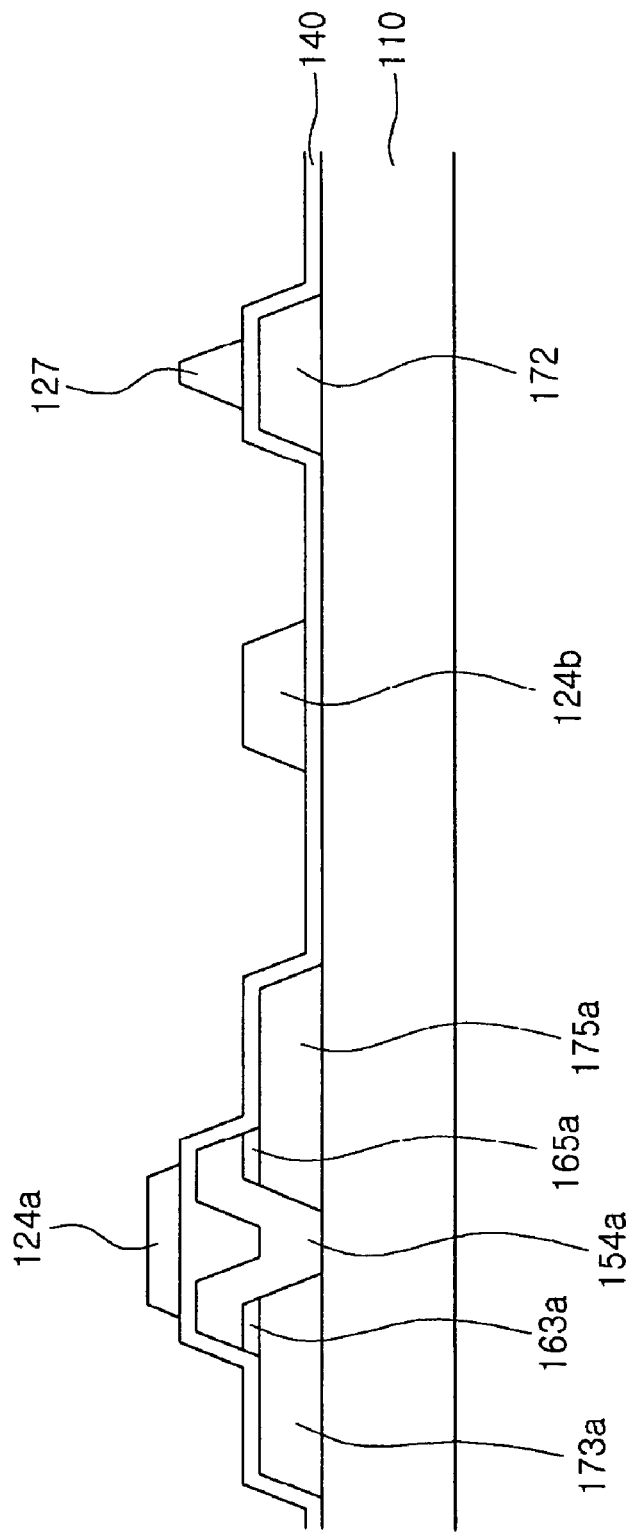
FIG. 15A and FIG. 15B are schematic cross-sectional views cut along XVA-XVA' and XVB-XVB' of FIG. 14.
Figure 15B:
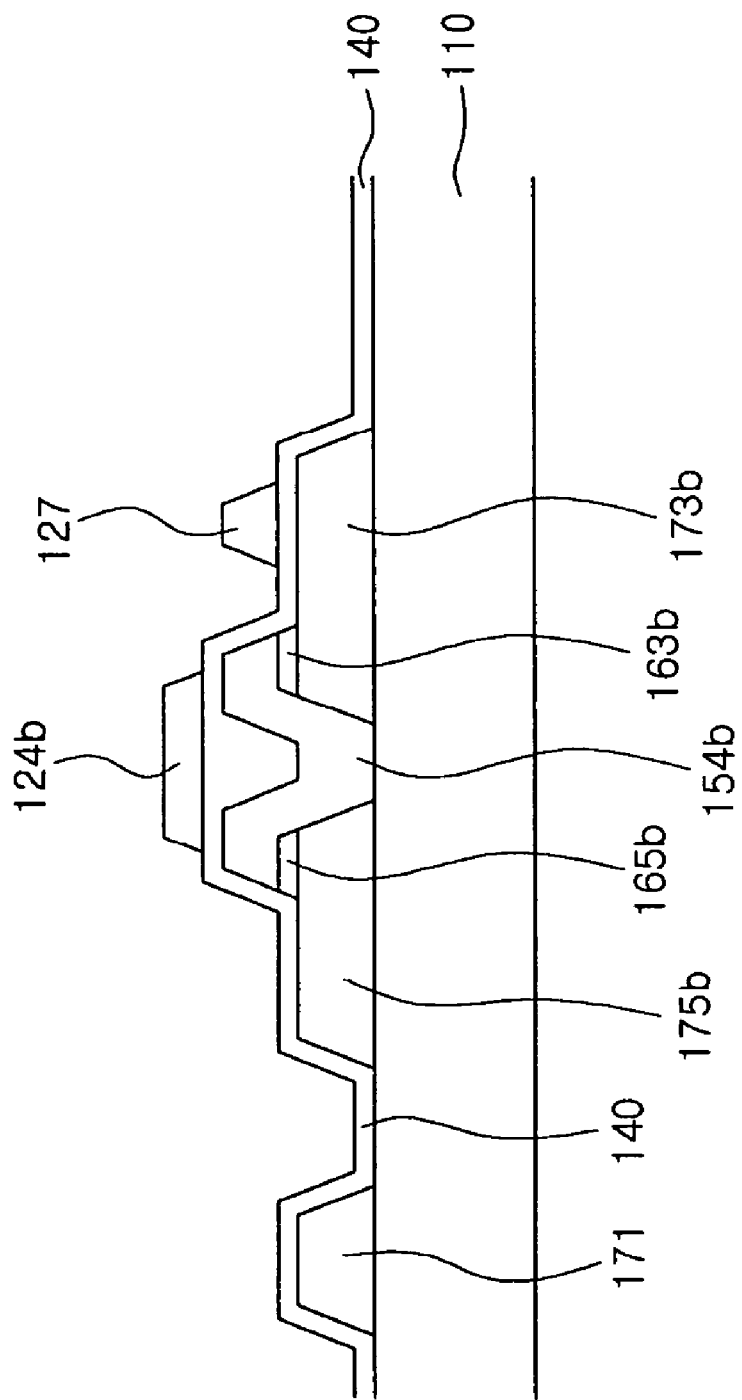
Figure 16:
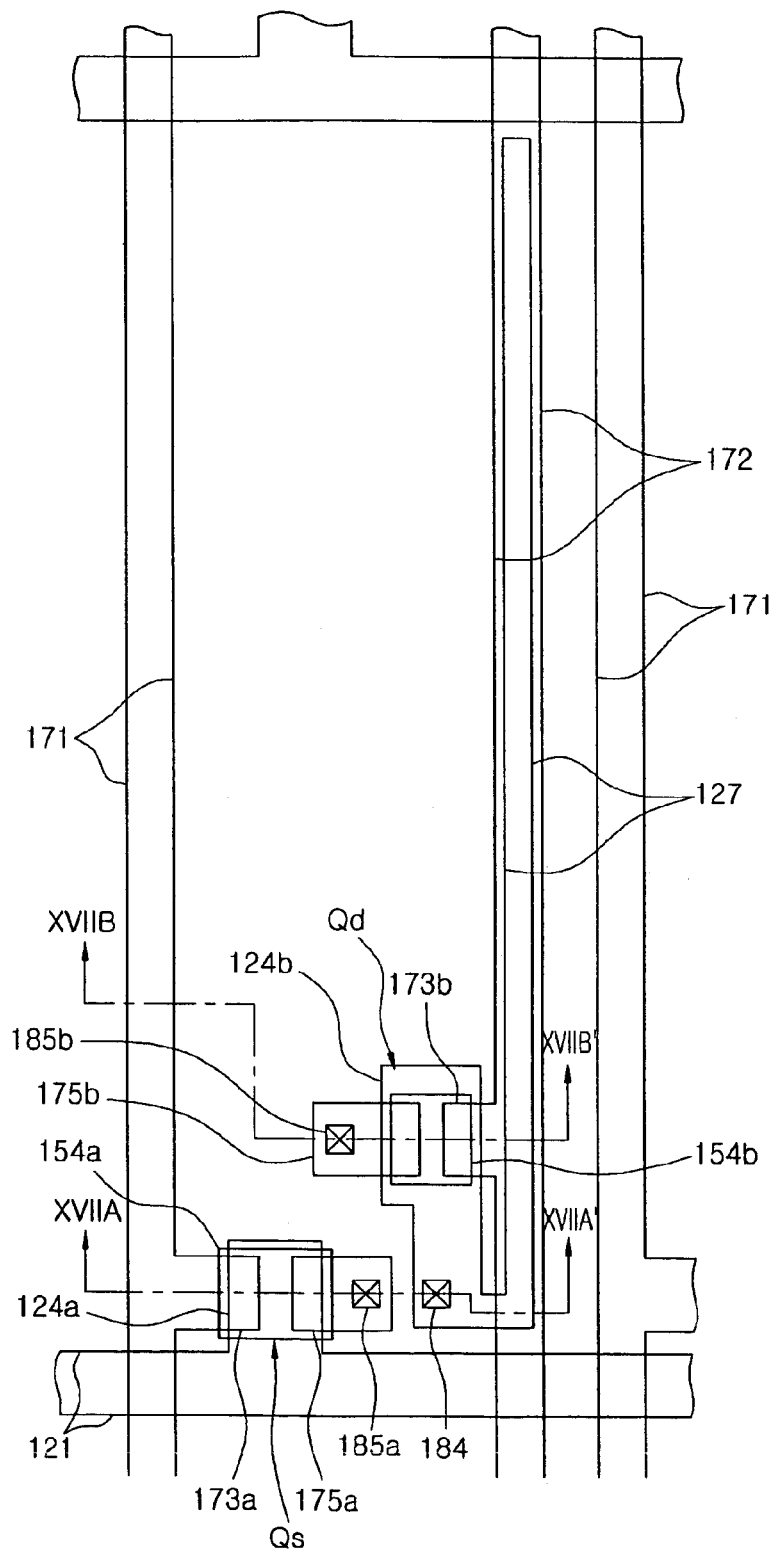
Figure 17A:
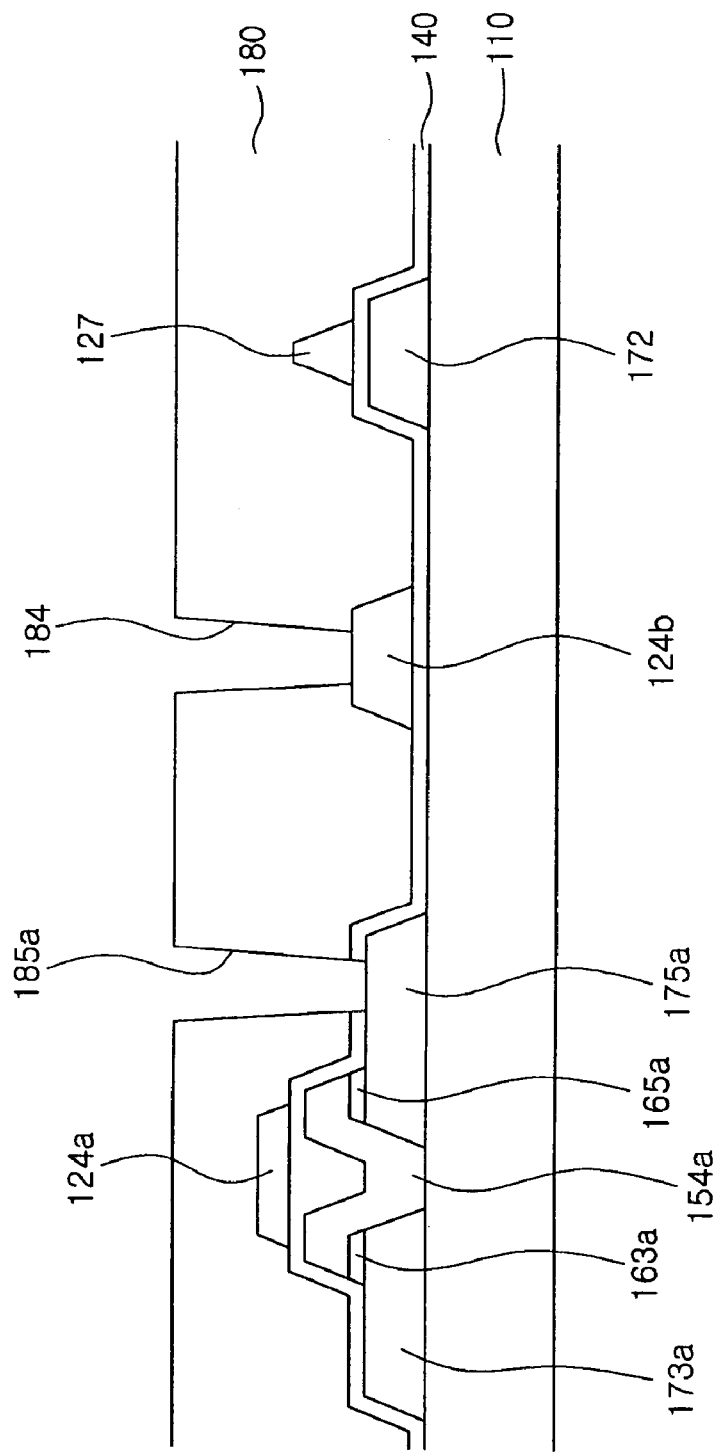
FIG. 17A and FIG. 17B are schematic cross-sectional views cut along XVIIA-XVIIA' and XVIIB-XVIIB' of FIG. 16.
Figure 17B:
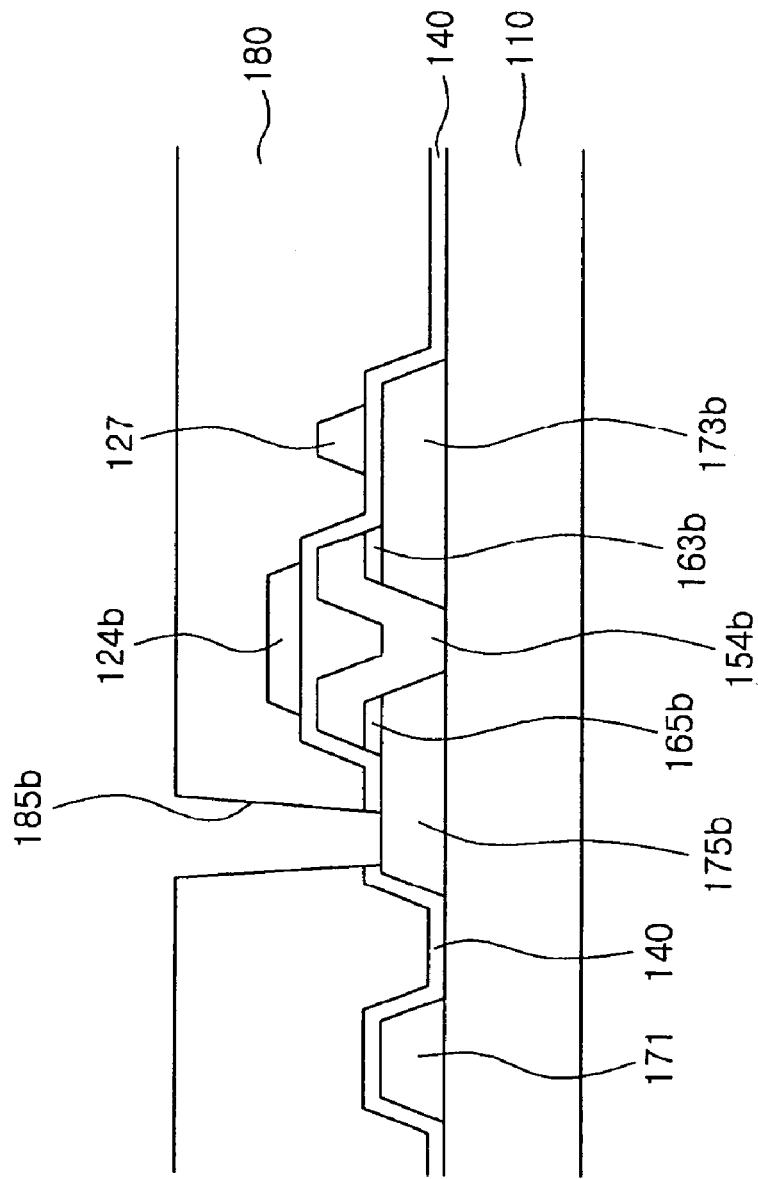
Figure 18:
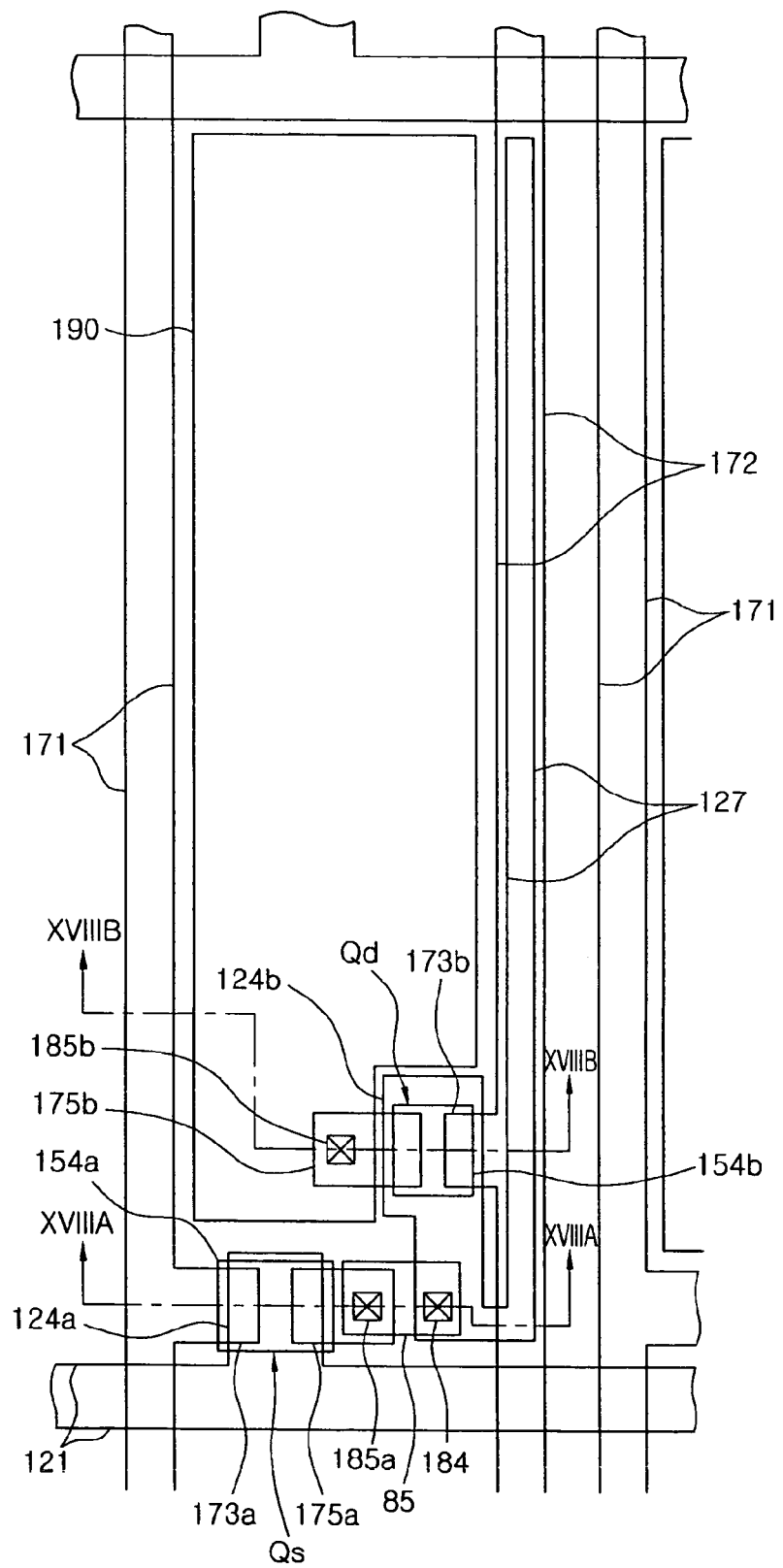
Figure 19A:
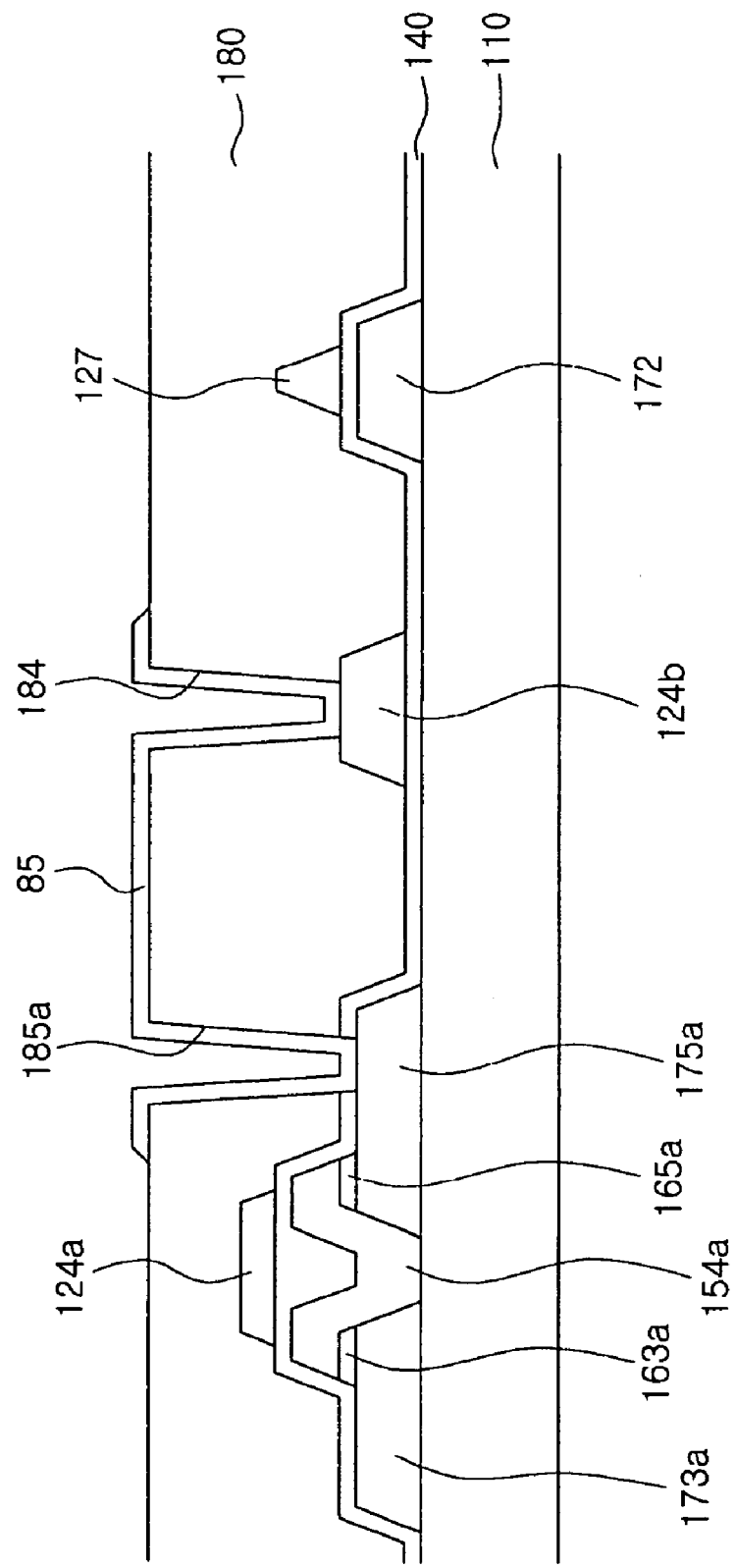
Figure 20:
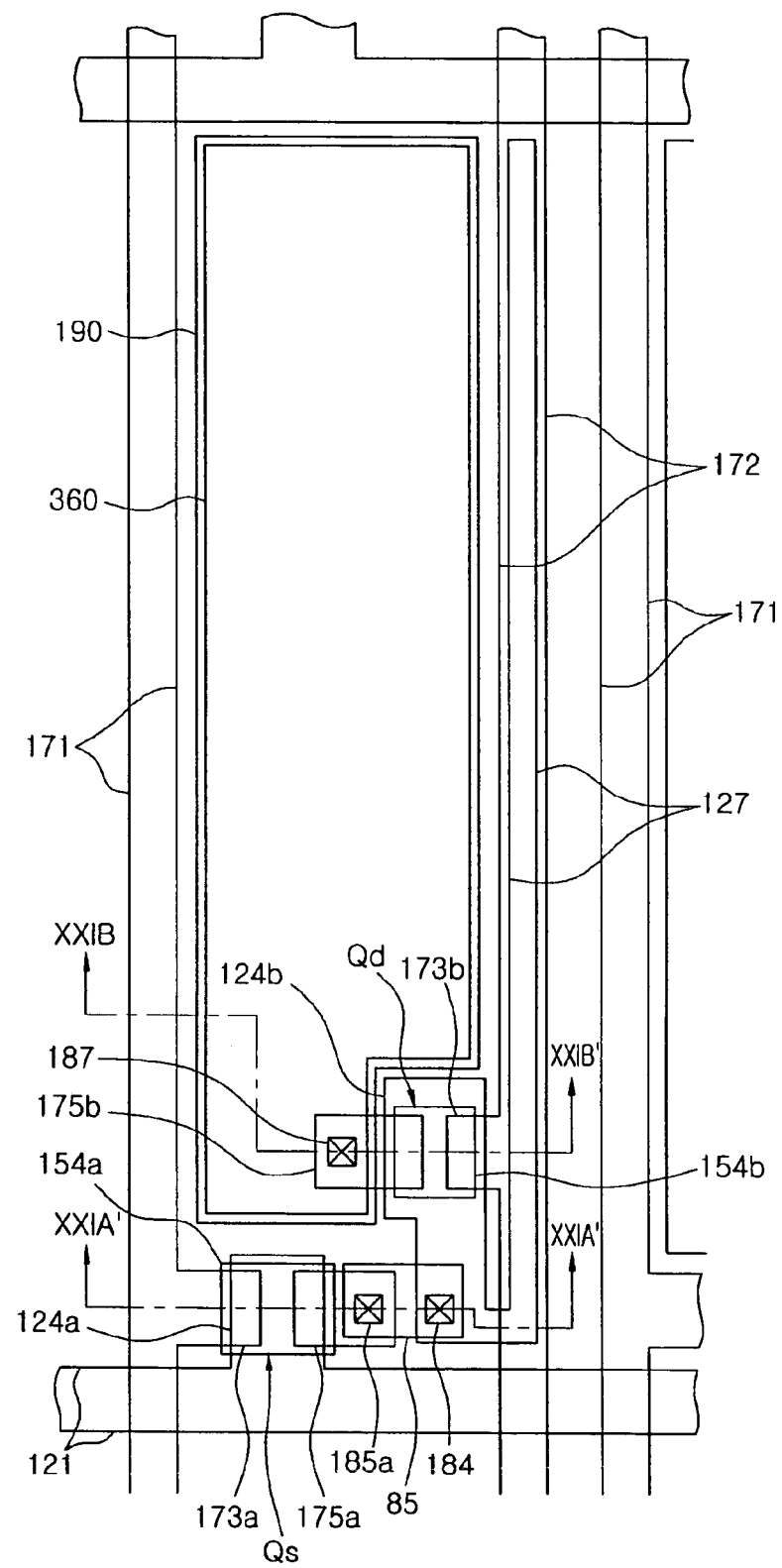
Figure 21A:
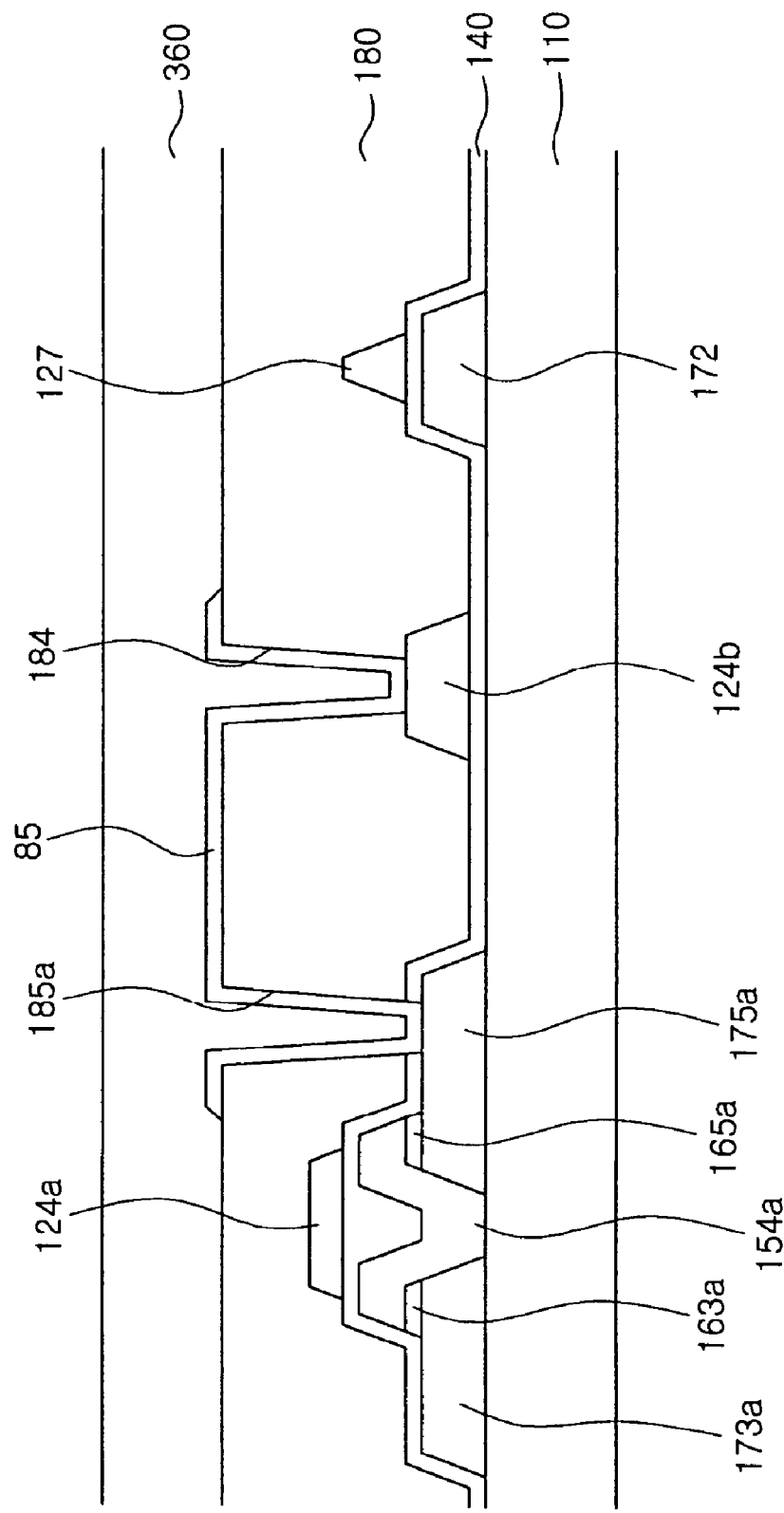
FIG. 21A and FIG. 21B are schematic cross-sectional views cut along XXIA-XXIA' and XXIB-XXIB' of FIG. 20.
Figure 21B:
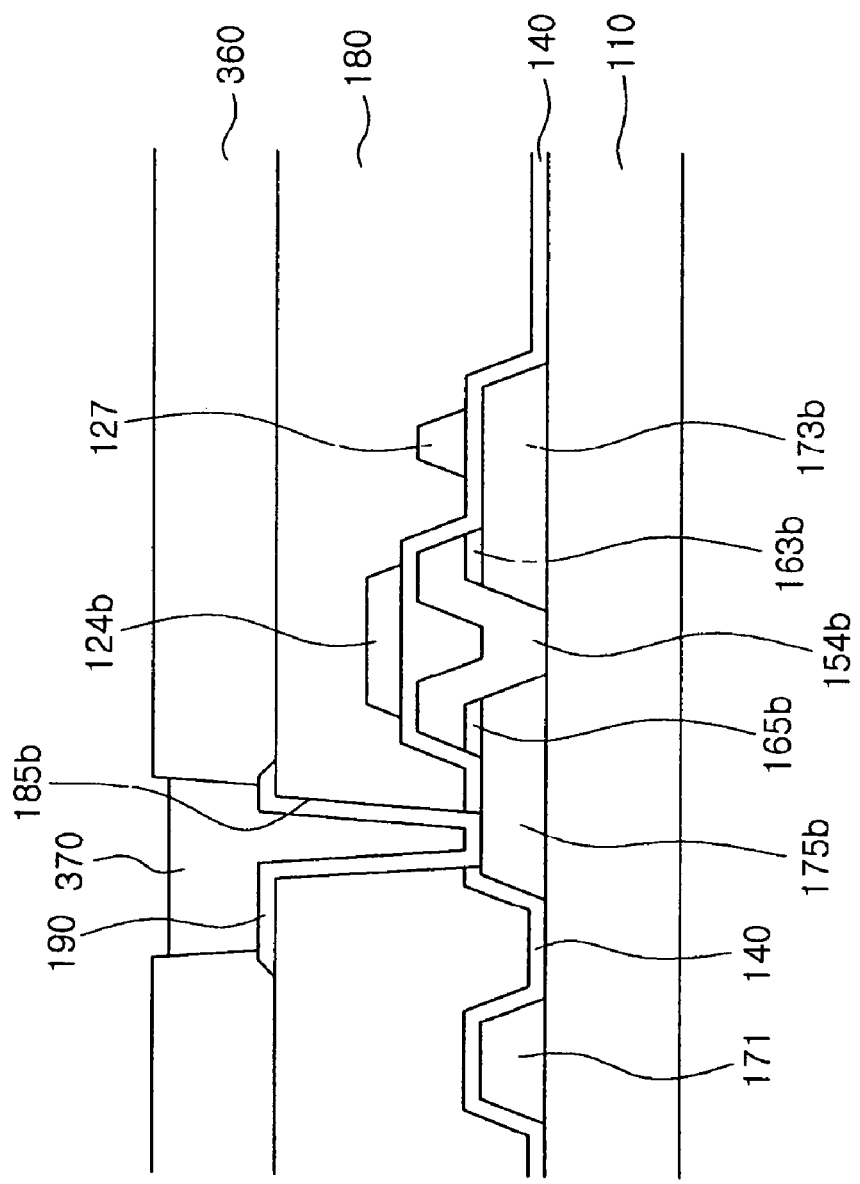

FIG. 9, FIG. 11, FIG. 14, FIG. 16, FIG. 18, and FIG. 20 are layout views for explaining the intermediate process steps to manufacture the OLED shown in FIG. 2 through FIG. 4. FIG. 10A and FIG. 10B are schematic cross-sectional views cut along XA-XA' and XB-XB' of FIG. 9, FIG. 12A and FIG. 12B are schematic cross-sectional views cut along XIIA-XIIA' and XIIB-XIIB' of FIG. 11, FIG. 13 is a photograph showing a vertical scheme of a semiconductor photographed by a transmission electron microscope (TEM), FIG. 15A and FIG. 15B are schematic cross-sectional views cut along XVA-XVA' and XVB-XVB' of FIG. 14, FIG. 17A and FIG. 17B are schematic cross-sectional views cut along XVIIA-XVIIA' and XVIIB-XVIIB' of FIG. 16, FIG. 19A and FIG. 19B are schematic cross-sectional views cut along XVIIIA-XVIIIA' and XVIIIB-XVIIIB' of FIG. 18, and FIG. 21A and FIG. 21B are schematic cross-sectional views cut along XXIA-XXIA' and XXIB-XXIB' of FIG. 20.

The first process step is explained with reference to FIG. 9 through FIG. 10B.

A conductive layer is first formed over an insulating substrate 110 by a sputtering process. Then, an amorphous silicon layer doped with $N^+$ impurities is deposited on the conductive layer by a chemical vapor deposition (CVD) process.

Next, the conductive layer and the amorphous silicon layer are selectively etched by photolithography. As a result, a plurality of data lines 171 with first input electrodes 173a, a plurality of driving voltage lines 172 with second input electrodes 173b, and a plurality of pairs of first and second output electrodes 175a and 175b, a plurality of linear semiconductors 161 and 162, and a plurality of island-shaped semiconductors 165a' and 165b' are formed as shown in FIG. 9, FIG. 10A, and FIG. 10B.

The next step is explained with reference to FIG. 11, FIG. 12A, and FIG. 12B.

An intrinsic silicon layer is formed on the structures shown in FIG. 10A and FIG. 10B by a CVD process or sputtering process.

The CVD process is performed at a deposition temperature of 250° C. to 370° C., utilizing a mixture gas of hydrogen and a silicon-containing gas such as $SiH_4$, $SiH_2Cl_2$, or $SiH_2F_2$, as a reactive gas. The preferable volume of the silicon-containing gas is less than 0.05% of the total volume of the reactive gas.

As the TEM picture of FIG. 13 shows, only the growth of amorphous silicon (expressed as black) takes place at the initial stage of the CVD process, but the amount of polycrystalline silicon (expressed as white) gradually increases as process time elapses. Finally, only the growth of polycrystalline silicon takes place at the late stage of the process.

Alternately, in the sputtering process utilizing reactive magnetron sputtering technology, the substrate 110 is placed in a reaction chamber with a silicon target. During the process, the pressure in the chamber is maintained between 0 mTorr and 5.5 mTorr and the temperature in the chamber is maintained between 250° C. and 400° C. First, an inert gas, which is a mixture of an inactive gas (such as argon, helium, or neon) and hydrogen, is injected into the reaction chamber, so that an extremely thin seed layer with a thickness of below 100 Å is deposited on the substrate 100. The seed layer has a state of amorphous silicon or microcrystalline. Next, only the inactive gas without hydrogen is injected into the chamber. With the gas injection, the growth of silicon begins on the seed layer. At the initial stage, only the growth of amorphous silicon occurs. However, as process time elapses, the growth of polycrystalline silicon gradually increases.

In the sputtering process using reactive magnetron sputtering equipment, crystallinity of the silicon film is controlled by the amount of ion flux flowing towards the growing silicon film on the substrate 110 which is determined by the intensity of a current to be applied to a magnetic coil. Accordingly, suitable current control can improve crystallinity.

However, after the seed layer is first formed by sputtering or CVD, the growth of silicon may be performed on the seed layer by CVD or sputtering.

Polycrystalline silicon formed in the above-mentioned manners has uniform crystallinity over the entire substrate 110.

Next, the overlying intrinsic silicon layer and the underlying linear and island-shaped impurity semiconductors 161, 162, 165a', and 165b' are selectively etched by photolithography. As a result, a plurality of island-shaped semiconductors 154a and 154b are formed, while a plurality of ohmic contacts 163a, 163b, 165a, and 165b are completed, as shown in FIG. 12A and FIG. 12B.

As shown in FIG. 5 and FIG. 6, a plurality of insulating elements 140a and 140b may be formed on the island-shaped semiconductors 154a and 154b. In this case, after a thin insulating layer made of $SiO_2$ or $SiN_x$ is deposited on the intrinsic silicon layer, the insulating layer and the intrinsic silicon layer are etched at the same time by a photolithography process, so that the insulating elements 140a and 140b and the semiconductors 154a and 154b are formed at the same time. However, the insulating elements 140a and 140b may be obtained by oxidizing the surfaces of the island-shaped semiconductors 154a and 154b.

The insulating elements 140a and 140b may be formed to fully cover the island-shaped semiconductors 154a and 154b, as shown in FIG. 7 and FIG. 8. In this case, after the island-shaped semiconductors 154a and 154b are completed, a thin insulating layer is deposited on the semiconductors 154a and 154b, and then an etching process for the insulating layer is performed.

The insulating elements 140a and 140b protect the surfaces of the semiconductors 154a and 154b from contaminants caused by the subsequent etching process.

The next step is explained with reference to FIG. 14 through FIG. 15B. A gate insulating layer 140 is deposited on the resultants of FIG. 12A and FIG. 12B, and a conductive layer is deposited on the gate insulating layer 140 by a sputtering process. The conductive layer is then patterned using a mask. As a result, a plurality of gate lines 121 with first control electrodes 124a, and a plurality of second control electrodes 124b are formed on the gate insulating layer 140, as shown in FIG. 15A and FIG. 15B.

The next step is explained with reference to FIG. 16 through FIG. 17B. A passivation layer 180 is deposited on the gate lines 121 and the second control electrodes 124b. An etching process is then performed, so that a plurality of contact holes 184, 185a, and 185b are produced. As shown in FIG. 17A and FIG. 17B, the contact holes 184 are formed in the passivation layer 180 to expose the second control electrodes 124b, while the contact holes 185a and 185b are formed in the passivation layer 180 and the gate insulating layer 140 to expose the first and second output electrodes 175a and 175b.

The next step is explained with reference to FIG. 18 through FIG. 19B. A conductive layer made of a transparent conductor such as ITO or IZO is formed on the passivation layer 180 by a sputtering process. The conductive layer is selectively etched by photolithography, thereby forming a plurality of pixel electrodes 190 and a plurality of contact assistants 85.

The next step is explained with reference to FIG. 20 through FIG. 21B. An organic material with black pigments is coated on the substrate 110. An organic layer is partially exposed to light and is then developed, thereby forming a barrier 360. As shown in FIG. 21B, the barrier 360 defines a plurality of openings on the pixel electrodes 190 by surrounding the borders of the pixel electrodes 190. Each opening is filled with an organic light emitting element 370. The organic light emitting elements 370 are produced by means of inkjet printing technology.

Lastly, a conductive material is deposited on the organic light emitting elements 370, thereby forming a common electrode 270, as shown in FIG. 3 through FIG. 8.

The structures shown in FIG. 2 through FIG. 8 and the methods shown in FIG. 9 through FIG. 19B are also applicable to liquid crystal displays (LCDs).

Differing from the OLED, an LCD has two panels (not shown) facing each other and a liquid crystal (LC) layer (not shown) interposed between the two panels. In the LCD, the pixel electrodes 190 and the common electrode 270 are formed on different panels. Also, the LCD has no light emitting element 370, no driving voltage line 172, and no driving transistor $Q_d$. Alternately, in the LCD, the pixel electrodes 190 are directly connected to the first output electrodes 175a of the switching transistors $Q_s$.

Figure 22:
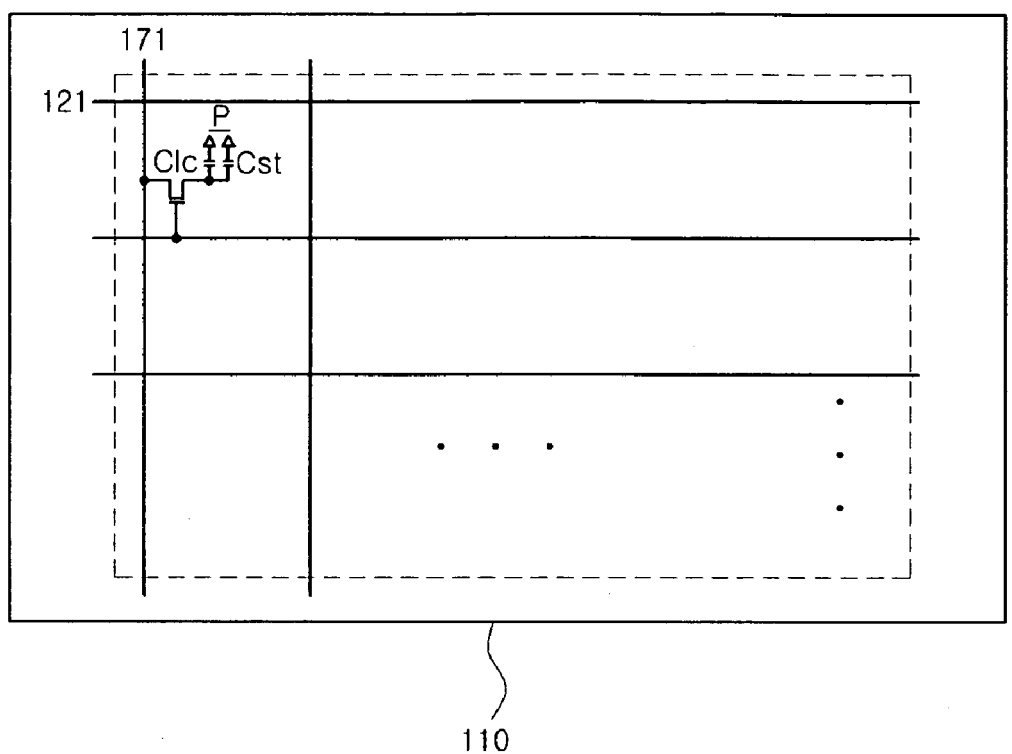
FIG. 22 shows an equivalent circuit view of an LCD according to another embodiment of the present invention.

FIG. 22 shows an equivalent circuit view of an LCD. Referring to FIG. 22, each pixel includes an LC capacitor $C_{lc}$ that consists of a pixel electrode 190, a common electrode 270, and an LC layer interposed between the two electrodes. In the LCD, each pixel further includes a storage capacitor $C_{st}$ connected to the LC capacitor in parallel. The storage capacitor $C_{st}$ is implemented by overlapping a pixel electrode 190 or a first output electrode 175a connected to the pixel electrode 190 with a separate signal line such as a storage electrode (not shown), or a previous gate line 121.

The LCD is provided with a separate light source and at least a polarizer (both not shown) since it is a light-receiving device that is incapable of self-emitting. In addition, for full color display, a plurality of color filters (not shown) aligned with the respective pixel electrodes 190 are further included in the LCD.

Furthermore, the LCD further includes two alignment layers to align LC molecules in the LC layer in a desired direction.

As described above, the TFTs of the present invention have high mobility because of the polycrystalline silicon used to form the channel region of the TFT. Accordingly, the TFT array panel with such TFTs exhibits good characteristics. Also, process time to manufacture such a panel is shortened and manufacturing cost is reduced.

The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the instant specification.

What is claimed is:

1. A method of manufacturing a thin film transistor array panel, the method comprising:
   forming a first electrode and a second electrode that are separated from each other on a substrate;
   forming a silicon layer comprising amorphous silicon and polycrystalline silicon on the substrate, the silicon layer having a lower portion and an upper portion, wherein a ratio of polycrystalline silicon to amorphous silicon in the lower portion is different than a ratio of polycrystalline silicon to amorphous silicon in the upper portion;
   forming a semiconductor by patterning the silicon layer;
   forming a gate insulating layer on the semiconductor;
   forming a third electrode to overlap the semiconductor on the gate insulating layer;
   forming a passivation layer on the third electrode; and
   forming a pixel electrode on the passivation layer,
   wherein the upper portion is nearer to the third electrode than the lower portion, and
   wherein forming the silicon layer comprises forming a seed layer utilizing a mixture gas of an inactive gas and a hydrogen gas in a reaction chamber, and then subsequently growing the silicon layer on the seed layer by introducing the inactive gas in an absence of hydrogen gas in the reaction chamber.

2. The method of claim 1, wherein the forming of the silicon layer comprises a sputtering process that is performed utilizing a silicon target.

3. The method of claim 2, wherein the sputtering process is performed at a deposition temperature of 250° C. to 370° C. under a working pressure of 0m Torr to 5.5m Torr.

4. The method of claim 2, wherein the inactive gas comprises argon gas.

5. The method of claim 1, further comprising forming an insulating element between the semiconductor and the gate insulating layer.

6. The method of claim 1, further comprising:
   forming a barrier with an opening that is placed on the pixel electrode;
   forming an organic light emitting element in the opening; and
   forming a common electrode on the organic light emitting element.

7. The method of claim 1, wherein a ratio of polycrystalline silicon to amorphous silicon in the lower portion is less than a ratio of polycrystalline silicon to amorphous silicon in the upper portion.

8. The method of claim 1, wherein a ratio of polycrystalline silicon to amorphous silicon in the silicon layer varies with respect to a distance from a surface of the silicon layer.

9. A method of manufacturing a thin film transistor array panel, the method comprising:
   forming a first electrode and a second electrode that are separated from each other on a substrate;
   forming a silicon layer comprising amorphous silicon and polycrystalline silicon on a surface of the substrate;
   forming a semiconductor by patterning the silicon layer;
   forming a gate insulating layer on the semiconductor;
   forming a third electrode overlapping the semiconductor on the gate insulating layer;
   forming a passivation layer on the third electrode; and
   forming a pixel electrode on the passivation layer,
   wherein a ratio of polycrystalline silicon to amorphous silicon in the silicon layer increases in a direction towards the third electrode from the surface of the substrate, and
   wherein forming the silicon layer comprises forming a seed layer utilizing a mixture gas of an inactive gas and a hydrogen gas in a reaction chamber, and then subsequently growing the silicon layer on the seed layer by introducing the inactive gas without the hydrogen gas in the reaction chamber.

* * * * *